(12) United States Patent
Ohkawa

(10) Patent No.: US 7,777,353 B2
(45) Date of Patent: Aug. 17, 2010

(54) SEMICONDUCTOR DEVICE AND WIRE BONDING METHOD THEREFOR

(75) Inventor: Shinya Ohkawa, Kagoshima-Ken (JP)

(73) Assignee: Yamaha Corporation, Shizuoka-Ken (JP)

( * ) Notice: Subject to any disclaimer, the term of this patent is extended or adjusted under 35 U.S.C. 154(b) by 370 days.

(21) Appl. No.: 11/838,396

(22) Filed: Aug. 14, 2007

(65) Prior Publication Data

US 2008/0088012 A1 Apr. 17, 2008

(30) Foreign Application Priority Data

| Aug. 15, 2006 | (JP) | ............................. 2006-221457 |
| Sep. 5, 2006 | (JP) | ............................. 2006-240005 |
| Oct. 13, 2006 | (JP) | ............................. 2006-280313 |

(51) Int. Cl.
*H01L 23/48* (2006.01)

(52) U.S. Cl. ........................................ 257/784; 257/786

(58) Field of Classification Search ....................... None
See application file for complete search history.

(56) References Cited

U.S. PATENT DOCUMENTS

| 4,987,473 | A | * | 1/1991 | Johnson | ........................ 257/676 |
| 5,359,227 | A | * | 10/1994 | Liang et al. | .................. 257/784 |
| 5,530,281 | A | * | 6/1996 | Groover et al. | ............. 257/666 |
| 6,068,180 | A | * | 5/2000 | Test | ........................ 228/180.5 |
| 6,407,333 | B1 | * | 6/2002 | Schroen | ....................... 174/529 |
| 6,900,551 | B2 | * | 5/2005 | Matsuzawa et al. | .......... 257/786 |
| 6,946,324 | B1 | * | 9/2005 | McLellan et al. | ............ 438/111 |
| 7,049,177 | B1 | * | 5/2006 | Fan et al. | ..................... 438/123 |
| 7,102,216 | B1 | * | 9/2006 | Foster | ......................... 257/673 |
| 7,170,149 | B2 | * | 1/2007 | Shirasaka et al. | ........... 257/666 |

FOREIGN PATENT DOCUMENTS

| JP | 6-302638 A | 10/1994 |
| JP | 2004-056021 A | 2/2004 |
| JP | 2005-012140 A | 1/2005 |

* cited by examiner

*Primary Examiner*—Scott B Geyer
(74) *Attorney, Agent, or Firm*—Dickstein Shapiro LLP

(57) ABSTRACT

In a semiconductor device, first wires each having a relatively low loop height are formed between a first lead and a plurality of first electrode pads aligned in a first line, and then second wires each having a relatively high loop height are formed between a second lead and a plurality of second electrode pads aligned in a second line, wherein the second line is distanced from the first line in view of the first and second leads. Wire bonding is sequentially performed so as to increase the height difference between the first wire and the second wire, thus avoiding the occurrence of electric short-circuiting between adjacently arranged wires. In wire bonding, a bump forming process, a ball bonding process, and a wedge bonding process are sequentially performed. It is preferable that the second lead be vertically distanced from the first lead in the thickness direction.

3 Claims, 17 Drawing Sheets

SEMICONDUCTOR DEVICE AND WIRE BONDING METHOD THEREFOR

BACKGROUND OF THE INVENTION

1. Field of the Invention

The present invention relates to semiconductor devices and wire bonding methods therefor. The present invention also relates to manufacturing methods of semiconductor devices using lead frames.

This application claims priority on Japanese Patent Application No. 2006-221457, Japanese Patent Application No. 2006-240005, and Japanese Patent Application No. 2006-280313, the contents of which are incorporated herein by reference.

2. Description of the Related Art

Japanese Unexamined Patent Application Publication No. H06-302638 teaches an example of a semiconductor device in which bonding wires are arranged so as not to come in contact with each other, wherein electrode pads of a semiconductor chip are each electrically connected to leads arranged in the periphery of the semiconductor chip via wires. In this semiconductor device, when electric currents flowing between the electrode pads and leads increase, the wires are heated and melted, or voids unexpectedly occur due to alloy diffusion at joining portions between the wires and leads.

A conventionally-known method for solving the aforementioned drawback is realized by the constitution in which a plurality of wires are arranged between a single lead and a single electrode pad and each have a reduced magnitude of electric current flowing therethrough. In order to downsize the semiconductor device adopting the aforementioned constitution, wire bonding positions are aligned in a longitudinal direction of the leads. Since a relatively large number of wire bonding positions should be arranged within the limited area of a semiconductor chip, wire bonding positions must be set inwardly of the periphery of the semiconductor chip as well.

However, the aforementioned constitution has a drawback in that electric short-circuiting may occur between the wires, which are arranged very close to each other within the wires connected to the adjacently arranged leads.

Japanese Unexamined Patent Application Publication No. 2004-56021 and Japanese Unexamined Patent Application Publication No. 2005-12140 teach wire bonding methods in which bonding pads formed on semiconductor chips are electrically connected to contacts such as leads of lead frames and electrode pads formed on boards for mounting semiconductor chips via metal wires, wherein a first bonding is performed so that distal ends of wires join one of bonding pads and contacts by way of ball bonding, and then a second bonding is performed so that rear-ends of wires join the other of bonding pads and contacts by way of wedge bonding.

In the first bonding, metal balls whose sizes are larger than the diameters of wires are formed at the distal ends of the wires, which are supplied from the terminal end of a capillary, in advance, so that the terminal end of the capillary presses the metal balls toward one of the bonding pads and the contacts so as to perform compression bonding on the metal balls. In the second bonding, the rear-ends of the wires are held between the terminal end of the capillary and the other of the bonding pads and the contacts and are thus subjected to compression bonding.

Compared with ball bonding, wedge bonding realizes relatively weak joining strengths. For this reason, metal bumps are formed in advance on the other of the bonding pads and the contacts by use of the capillary, and then the rear-ends of the wires join the metal bumps in the second bonding.

Both of the metal balls and metal bumps, which are attached onto the bonding pads and contacts in the conventionally-known wire bonding method, are formed by use of the capillary for supplying wires, wherein they are formed by pressing the distal ends of the wires onto the bonding pads and contacts. For this reason, the sizes of the metal balls and metal bumps become larger than diameters of the wires, wherein the size of a typical example of the metal ball or metal bump is increased to at least two-times larger than the diameter of the wire. In other words, it is necessary to set the sizes of the bonding pads and contacts in conformity with the sizes of the metal balls and metal bumps rather than the diameters of the wires.

When semiconductor chips, boards, and lead frames are used in digital amplifiers, relatively high electric currents flow through wires; hence, it is necessary to use large-diameter wires in establishing electrical connections. This also increases the sizes of the bonding pads and contacts as well.

Due to recent tendencies regarding high integration and downsizing of semiconductor devices, distances between adjacent electrode pads and distances between adjacent leads tend to be reduced, whereby distances between wires are correspondingly reduced. Japanese Unexamined Patent Application Publication No. H06-302638 teaches that electrode pads and leads are each arranged in a zigzag manner, or adjacent wires are varied in loop heights thereof, thus preventing adjacent wires from coming in contact with each other. Herein, the wires join the leads at the substantially same height; hence, electric short-circuiting may likely occur between adjacent wires in proximity to leads.

SUMMARY OF THE INVENTION

It is an object of the present invention to provide a semiconductor device and a wire bonding method therefor, which reliably prevent electric short-circuiting from occurring between adjacent wires connected to leads.

It is another object of the present invention to provide a wire bonding method that allows large-diameter wires to join bonding pads and contacts having relatively small sizes.

It is a further object of the present invention to provide semiconductor device using a lead frame and a manufacturing method thereof, which reliably prevents electric short-circuiting from occurring between adjacently positioned wires in proximity to leads.

In a first aspect of the present invention, there is provided a semiconductor device in which a plurality of leads are each connected to a plurality of electrode pads formed in the periphery of a semiconductor chip via a plurality of wires, wherein the semiconductor device includes a first set of electrode pads aligned adjacent to each other in a first line that is defined opposite to and relatively close to a first lead, in which a plurality of first bonds corresponding to the first set of electrode pads are connected to a plurality of second bonds aligned in the first lead in its longitudinal direction via a first set of wires each having a relatively low loop height, a second set of electrode pads aligned adjacent to each other in a second line that is defined opposite to and relatively distant from a second lead arranged adjacent to and in parallel with the first lead, in which a plurality of first bonds corresponding to the second set of electrode pads are connected to a plurality of second bonds aligned in the second lead in its longitudinal direction via a second set of wires each having a relatively high loop height. Herein, a distant second bond that is distant from the first line within the plurality of second bonds of the first lead is connected to a prescribed first bond within the plurality of first bonds corresponding to the first set of electrode pads except for a first bond positioned very close to the second line. Alternatively, a near second bond that is close to the second line within the plurality of second bonds of the second lead is connected to a prescribed first bond within the plurality of first bonds corresponding to the second set of electrode pads except for a first bond positioned very close to the first line. In addition, a first wire within the first set of the wires crosses a second wire within the second set of wires in plan view but with a prescribed height difference therebetween at an intersecting point, and the prescribed height difference between the first wire and the second wire is larger than a height difference between the first wire and one of the second set of wires that is adjacent to the second wire and is also larger than a height difference between the second wire and one of the first set of wires that is adjacent to the first wire.

In the above, the first set of wires include a plurality of raised portions, which vertically rise from the first set of electrode pads and each of which has the relatively low loop height, and the second set of wires include a plurality of raised portions, which vertically rise from the second set of electrode pads and each of which has the relatively high loop height larger than the relatively low loop height.

In a wire bonding method adapted to the semiconductor device, a first set of wires between the first bonds and the second bonds are sequentially subjected to bonding, and then a second set of wires between the first bonds and the second bonds are sequentially subjected to bonding, wherein the wires are formed between the first bonds positioned at both ends of the first line and the second bonds of the first lead, and then the wire is formed between the first bond positioned at the center of the first line and the second bond of the first lead. Alternatively, the wire is formed between the first bond positioned at the center of the second line and the second bond of the second lead, and then the wires are formed between the first bonds positioned at both ends of the second line and the second bonds of the second lead.

The aforementioned wire bonding method makes it possible to increase the height difference between the first wire and the second wire, thus reliably avoiding the occurrence of electric short-circuiting between the wires respectively connected to the mutually adjoining leads.

In a second aspect of the present invention, a wire bonding method is performed to electrically connect a plurality of bonding pads formed on a semiconductor chip and a plurality of connection pads arranged in the periphery of the semiconductor chip via a plurality of metal wires by way of a bump forming process, a ball bonding process, and a wedge bonding process. In the bump forming process, the terminal end of a small-diameter capillary for supplying a thin wire is pressed onto at least one of the bonding pad and connection pad so as to form a metal bump thereon. In the ball bonding process, a metal ball is formed on the distal end of a wire supplied from the terminal end of a capillary, and then the terminal end of the capillary is pressed onto one of the bonding pad and connection pad so that the metal ball joins one of the bonding pad and connection pad. In the wedge bonding process, the capillary moves from one of the bonding pad and connection pad to the other of the bonding pad and connection pad while continuously supplying the wire from the terminal end thereof, and then the terminal end of the capillary presses the rear-end of the wire onto the other of the bonding pad and connection pad so that the rear-end of the wire joins the other of the bonding pad and connection pad.

In the above, the metal ball formed at the distal end of the wire or the rear-end of the wire joins the bond pad or the connection pad via the metal bump. Since the metal ball or the rear-end of the wire does not directly join the bonding pad or the connection pad, the size of the metal ball or the diameter of the wire does not affect the size of the bonding pad or the size of the connection pad. Since the metal bump is formed using the small-diameter capillary, it is possible to reduce the size of the metal bump in comparison with the wire bonding method in which the metal bump is formed using the capillary for arranging the wire. That is, it is possible to set up the size of the bonding pad or the connection pad in response to the reduced size of the metal bump.

In addition, when the metal bump is formed on one of the bonding pad and connection pad in the bump forming process, a diameter $D1$ of the metal bump in view of one of the bonding pad and connection pad is defined in accordance with a relationship of $0.5 \times D2 \leqq D1 < 1.2 \times D2$, where $D2$ designates a diameter of the metal ball joining the metal bump. Thus, it is possible to avoid the occurrence of electric short-circuiting because one of the bonding pad and connection pad can be reduced in size. Furthermore, when the metal bump is formed on the other of the bonding pad and connection pad in the bump forming process, a diameter $D1$ of the metal bump in view of the other of the bonding pad and connection pad is defined in accordance with a relationship of $1.4 \times D3 \leqq D1 < 2.0 \times D3$, where $D3$ designates a diameter of the rear-end of the wire joining the metal bump. Thus, it is possible to adequately secure the joining strength between the rear-end of the wire and the metal bump whose size is reduced.

In a third aspect of the present invention, a semiconductor device is designed such that a plurality of electrode pads arranged in the periphery of a semiconductor chip are connected to a plurality of first and second leads each having a thin band-like shape via a plurality of wires, wherein the first and second leads are alternately arranged so as to adjoin together, wherein the wires each join the electrode pads and the first and second leads at both ends thereof, and wherein the distal ends of the second leads are vertically distanced from the distal ends of the first leads in the thickness direction. Herein, the second leads have bent portions, which interconnect the base portions thereof to the distal ends thereof and by which the distal ends thereof are vertically bent in the thickness direction. Alternatively, the second leads have step portions, which interconnect the base portions thereof to the distal ends thereof in a step-like manner and by which the distal ends thereof differ from the base portions thereof in height in the thickness direction. In addition, the wires are each vertically curved in a loop-like manner between the electrode pads and the distal ends of the first and second leads, wherein the distal ends of the second leads are vertically distanced from the distal ends of the first leads in the thickness direction, wherein the distal ends of the first leads are horizontally distanced from the semiconductor chip in comparison with the distal ends of the second leads, and wherein the loop heights of the wires joining the distal ends of the second leads are lower than the loop heights of the wires joining the distal ends of the first leads.

In the manufacturing method of the semiconductor device, a frame preparation process is performed to prepare a lead frame in which first and second leads each having a thin band-like shape are alternately arranged in the periphery of a stage having a planar shape and are integrally formed together with the stage; an installation process is performed to arrange a semiconductor chip having electrode pads on the surface of the stage; a wiring process is performed to electrically connect the distal ends of the first and second leads and the electrode pads via wires; and a lead processing process is performed after the wiring process so that the second leads adjoining the first leads are subjected to elastic deformation, wherein the distal ends of the second leads are vertically distanced from the distal ends of the first leads in the thickness direction of the stage.

In the above, the lead processing process can be performed in the period between the frame preparation process and the wiring process, wherein the second leads adjoining the first leads are subjected to elastic deformation so that the distal ends of the second leads are vertically distanced from the distal ends of the first leads in the thickness direction of the stage.

Furthermore, it is possible to perform an elastic deformation process after the lead processing process and before the wiring process, in which the second leads are subjected to elastic deformation so that the distal ends of the second leads are temporarily placed substantially at the same height with the distal ends of the first leads in the thickness direction, and it is possible to perform a restoration process after the wiring process, in which the second leads are released from the elastic deformation so that the distal ends of the second leads are restored to be vertically distanced from the distal ends of the first leads in the thickness direction.

As described above, it is possible to prevent the wires joining the distal ends of the leads, which are adjoined together and which are alternately distanced from each other in the thickness direction, from unexpectedly coming in contact with each other; hence, it is possible to reliably avoid the occurrence of electric short-circuiting between the wires adjoining together.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENTS

The present invention will be described in further detail by way of examples with reference to the accompanying drawings.

1. First Embodiment

Figure 1:
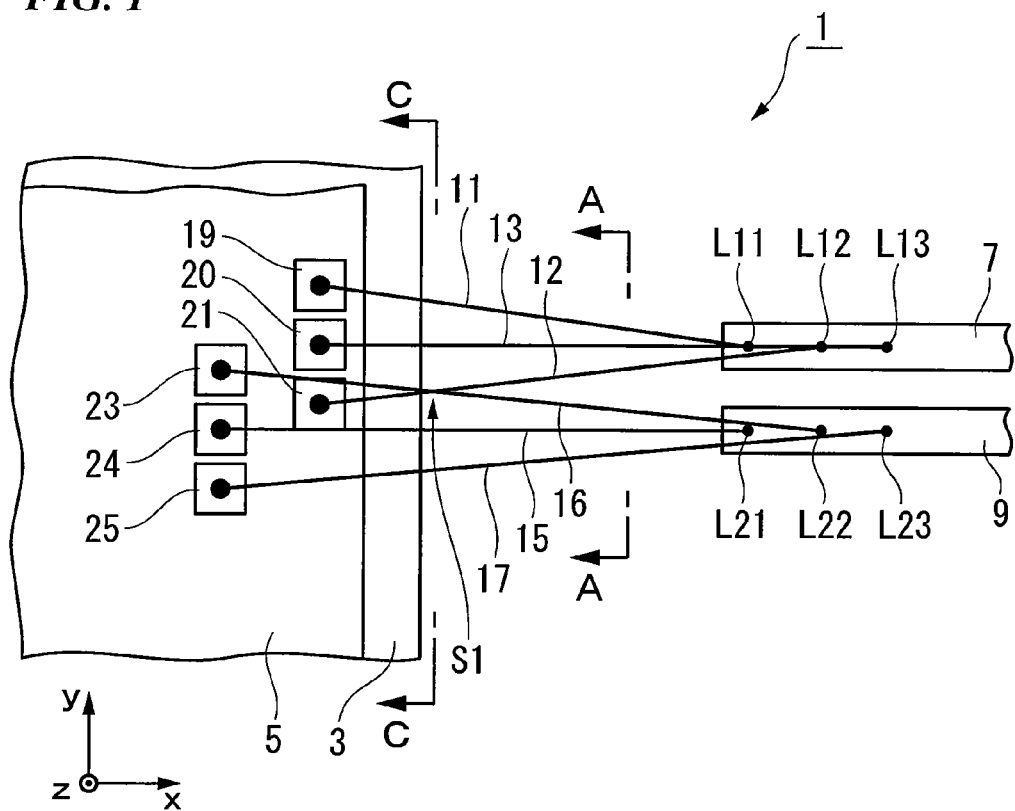
FIG. 1 is an enlarged plan view showing essential parts of a semiconductor device in accordance with a first embodiment of the present invention.
Figure 2:
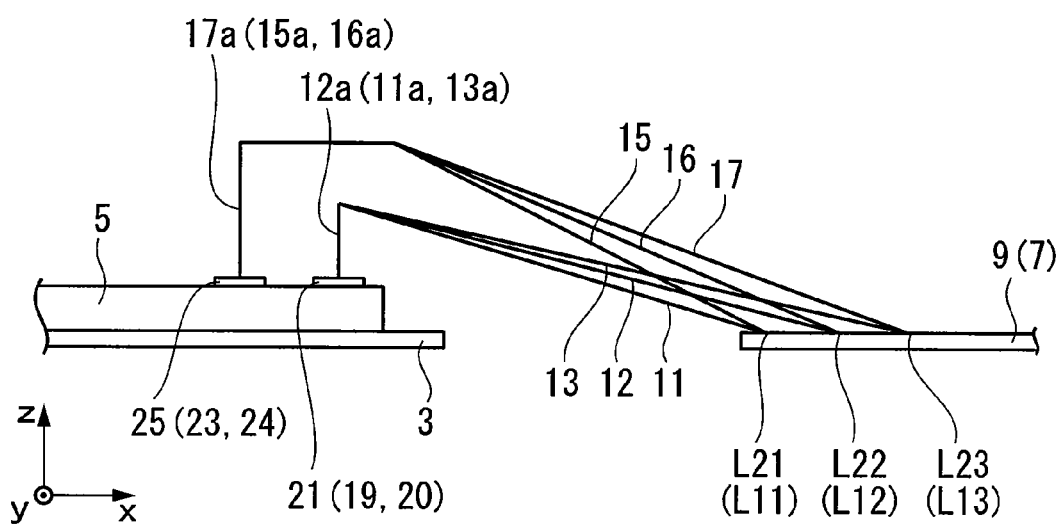
FIG. 2 is an enlarged side view showing relationships between electrode pads, wires, and leads included in the semiconductor device shown in FIG. 1.

A semiconductor device 1 according to a first embodiment of the present invention will be described with reference to FIGS. 1 to 4. As shown in FIGS. 1 and 2, a plurality of leads 7 and 9, which are positioned adjacent to each other, are arranged in the periphery of a semiconductor chip 5 mounted on a stage 3 having a planar shape, wherein the lead 7 is electrically connected to three electrode pads 19 to 21 via three wires 11 to 13, and the lead 9 is electrically connected to three electrode pads 23 to 25 via three wires 15 to 17. Plural sets of the lead and three electrodes connected via three wires are arranged for the semiconductor chip 5.

Each of the leads 7 and 9 has a slender shape elongated toward the semiconductor chip 5. Second bonds L11 to L13 connected to the wires 11 to 13 are aligned in the lead 7 in its longitudinal direction, and second bonds L21 to L23 connected to the wires 15 to 17 are aligned in the lead 9 in its longitudinal direction. Herein, three second bonds are positioned in the direction from the near side to the distant side distanced from the semiconductor chip 5. Incidentally, the second bonds L11 to L13 designate bonding positions of the wires 11 to 13 connected to the lead 7, and the second bonds L21 to L23 designate bonding positions of the wires 15 to 17 connected to the lead 9.

The wires 11 to 13 are each subjected to bonding at the electrode pads 19 to 21, and the wires 15 to 17 are each subjected to bonding at the electrode pads 23 to 25. In the semiconductor chip 5, first bonds for the lead 7 are formed between the wires 11 to 13 and the electrode pads 19 to 21, and first bonds for the lead 9 are formed between the wires 15 to 17 and the electrodes 23 to 25.

The electrodes 19 to 21 are aligned in a first line, which lies along a prescribed side of the semiconductor chip 5, in connection with the lead 7. The electrodes 23 to 25 are aligned in a second line, which lies along the prescribed side of the semiconductor chip 5 and which is distanced from the first line inwardly into the semiconductor chip 5, in connection with the lead 9.

As described above, the electrode pads 19 to 21 aligned in the first line are electrically connected to the lead 7 via the wires 11 to 13, and the electrode pads 23 to 25 aligned in the second line are electrically connected to the lead 9 via the wires 15 to 17. In addition, the electrode pads 19 to 21 aligned in the first line partially overlap the electrode pads 23 to 25 aligned in the second line in view of the longitudinal direction of the leads 7 and 9.

The distance between the lead 7 and the first line aligning the electrode pads 19 to 21 is shorter than the distance between the lead 9 and the second line aligning the electrode pads 23 to 25. Therefore, loop heights of the wires 11 to 13 connected between the lead 7 and the electrode pads 19 to 21 aligned in the first line are lower than loop heights of the wires 15 to 17 connected between the lead 9 and the electrode pads 23 to 25 aligned in the second line.

Specifically, as shown in FIG. 2, the wires 11 to 13 have raised portions 11a to 13a, which vertically rise up from the first bonds at the electrode pads 19 to 21, and the wires 15 to 17 have raised portions 15a to 17a, which vertically rise up from the first bonds at the electrode pads 23 to 25, wherein the raised portions 11a to 13a of the wires 11 to 13 are vertically lower than the raised portions 15a to 17a of the wires 15 to 17. Incidentally, each of the raised portions 11a to 13a of the wires 11 to 13 defines a highest point from each of the first bonds of the electrode pads 19 to 21, and each of the raised portions 15a to 17a of the wires 15 to 17 defines a highest point from each of the first bonds of the electrode pads 23 to 25.

Within plural sets of the wires connected to the leads in the semiconductor device 1, the loop heights of the wires are lowered as the second bonds thereof are positioned close to the semiconductor chip 5. Specifically, within the wires 11 to 13 connected to the lead 7, a lowest loop height is applied to the wire 11 connected to the second bond L11 that is closest to the semiconductor chip 5, while a highest loop height is applied to the wire 13 connected to the second bond L13 that is farthest from the semiconductor chip 5. Similarly, within the wires 15 to 17 connected to the lead 9, a lowest loop height is applied to the wire 15 connected to the second bond L21 that is closest to the semiconductor chip 5, while a highest loop height is applied to the wire 17 connected to the second bond L23 that is farthest from the semiconductor chip 5.

Different loop heights applied to the wires 11 to 13 and the wires 15 to 17 are defined by a wire bonding method that will be described later.

In the semiconductor device 1, the wire 13 connected to the distant second bond L13 of the lead 7, which is farthest from the semiconductor chip 5, is connected to the electrode pad 20 positioned between the electrode pads 19 and 21 in the first line. In addition, the wire 11 connected to the nearest second bond L11 of the lead, which is closest to the semiconductor chip 5, is connected to the electrode pad 19, and the wire 12 connected to the center second bond L12 of the lead 7 is connected to the electrode pad 21.

The wire 15 connected to the nearest second bond L21 of the lead 9, which is closest to the semiconductor chip 5, is connected to the electrode pad 24 positioned between the electrode pads 23 and 25 in the second line. In addition, the wire 16 connected to the center second bond L22 of the lead 9 is connected to the electrode pad 23, and the wire 17 connected to the distant second bond L23 of the lead 9, which is farthest from the semiconductor chip 5, is connected to the electrode pad 25.

Next, a wire bonding method applied to the semiconductor device 1 will be described in detail, wherein the leads 7 and 9 are respectively connected to the electrode pads 19 to 21 and the electrode pads 23 to 25 via the wires 11 to 13 and the wires 15 to 17.

In order to connect a single lead to a single pad via a wire, a ball is formed by melting the wire by means of a torch and is attached to a distal end of a capillary (not shown) in advance; the ball is subjected to thermal compression bonding onto the electrode pad so as to form a first bond; the capillary discharges the wire while moving upwardly; then, the capillary moves in a lateral direction toward the lead such that the wire forms a loop between the electrode and the lead. Then, the distal end of the capillary is pressed at a second bond position of the lead so that the wire is subjected to thermal compression bonding; thereafter, the capillary is moved upwards again so as to cut the wire.

It is possible to adopt the conventionally-known bonding method and bonding tools (using ultrasonic waves and the like) in the thermal compression bonding and cutting process. The raised portions 11a to 13a and 15a to 17a of the wires 11 to 13 and 15 to 17 are formed when the capillary moves upwardly from the electrode pads 19 to 21 and 23 to 25.

The aforementioned bonding method is performed in order from the relatively short wire to the relatively long wire within the wires 11 to 13 and 15 to 17. That is, the lead 7 is connected to the electrode pads 19 to 21 in the first line via the wires 11 to 13, and then the lead 9 is connected to the electrode pads 23 to 25 in the second line via the wires 15 to 17. With respect to the lead 7, the wires 11 to 13 are sequentially connected to the second bonds L11 to L13 in order from the nearest second bond L11 to the distant second bond L13. With respect to the lead 9, the wires 15 to 17 are sequentially connected to the second bonds L21 to L23 in order from the nearest second bond L21 to the distant second bond L23.

In the aforementioned wire bonding method, the loop heights of the wires 11 to 13, which connect the lead 7 with the electrode pads 19 to 21, are increased as they are lastly subjected to wire bonding. Similarly, the loop heights of the wires 15 to 17, which connect the lead 9 with the electrode pads s23 to 25, are increased as they are lastly subjected to wire bonding.

Next, the wire bonding order adapted to the lead 7, which is connected to the electrode pads 19 to 21 in the first line via the wires 11 to 13, will be described in detail. First, within the electrode pads 19 and 21 positioned at both ends of the first line, the electrode 19, which is farthest from the second line aligning the electrode pads 23 to 25, is connected to the nearest second bond L11 of the lead 7 via the wire 11. Next, the electrode pad 21, which is relatively close to the second line aligning the electrodes 23 to 25, is connected to the center second bond L12 of the lead 7 via the wire 12. Lastly, the electrode pad 20, which is positioned between the electrodes 19 and 21, is connected to the distant second bond L13 of the lead 7 via the wire 13.

After completion of the connection between the lead 7 and the electrodes 19 to 21, the lead 9 is connected to the electrode pads 23 to 25 via the wires 15 to 17. First, the electrode pad 24 positioned between the electrode pads 23 and 25, which are positioned at both ends of the second line, is connected to the near second bond L21 of the lead 9 via the wire 15. Next, within the electrode pads 23 and 25 positioned at both ends of the second line, the electrode pad 23, which is relatively close to the first line aligning the electrode pads 19 to 21, is connected to the center second bond L22 of the lead 9 via the wire 16. Lastly, the electrode pad 25, which is farthest from the first line, is connected to the distant second bond L23 via the wire 17.

In the above, the wires 15 to 17 are arranged in such a way that the raised portions 15a to 17a thereof become vertically higher than the raised portion 11a to 13a of the wires 11 to 13.

Figure 3:
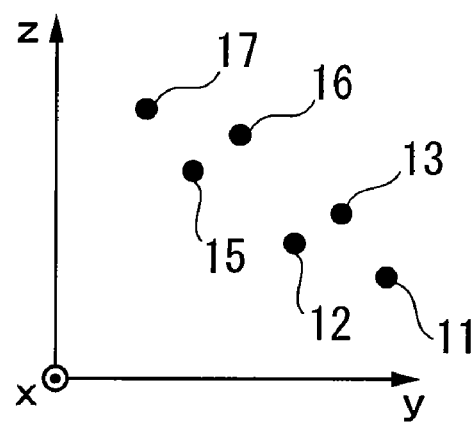
FIG. 3 is a simplified cross-sectional view taken along line A-A in FIG. 1, which shows positional relationships between the wires.

The wire bonding is repeatedly performed in the aforementioned order, wherein, as shown in FIG. 3, the loop heights of the wires 11 and 12, which are connected to the electrode pads 19 and 21 positioned at both ends of the first line, are lower than the loop height of the wire 13 connected to the electrode pad 20. In addition, the loop heights of the wires 16 and 17 connected to the electrode pads 23 and 25 positioned at both ends of the second line are higher than the loop height of the wire 15 connected to the electrode pad 24.

The wire 12, which is connected between the lead 7 and the electrode pad 21 that is closest to the second line aligning the electrodes 23 to 25, is mutually adjacent to the wire 16, which is connected between the lead 9 and the electrode pad 23 that is closest to the first line aligning the electrode pads 19 to 21, in plan view. The aforementioned wire bonding method increases the differences between the loop heights of the wires 12 and 16.

Figure 4:
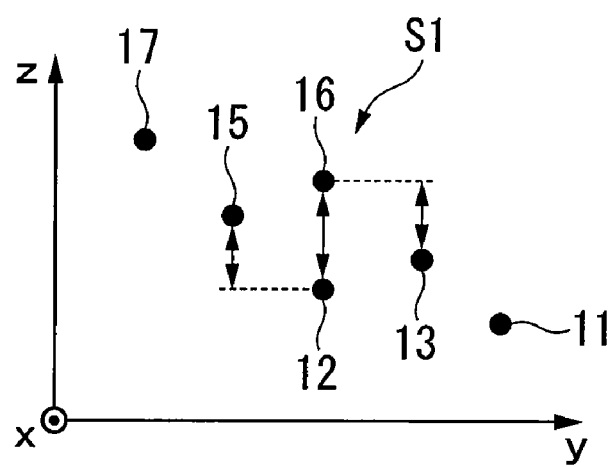
FIG. 4 is a simplified cross-sectional view taken along line C-C in FIG. 1, which shows positional relationships between the wires.

The wires 12 and 16 cross each other at an intersecting point S1 in plan view. FIG. 4 is a cross-sectional view taken along line C-C in FIG. 1, which is viewed in parallel with the arrangement direction of the leads 7 and 9 in relation to the intersecting point S1. Herein, a vertical distance (i.e., a z-axis distance shown in FIG. 4) between the wires 12 and 16 is larger than a vertical distance between the wire 12 and the wire 15, which is positioned adjacent to the wire 16 in proximity to the intersecting point S1, and is also larger than a vertical distance between the wire 16 and the wire 13, which is positioned adjacent to the wire 12 in proximity to the intersecting point S1.

Figure 5:
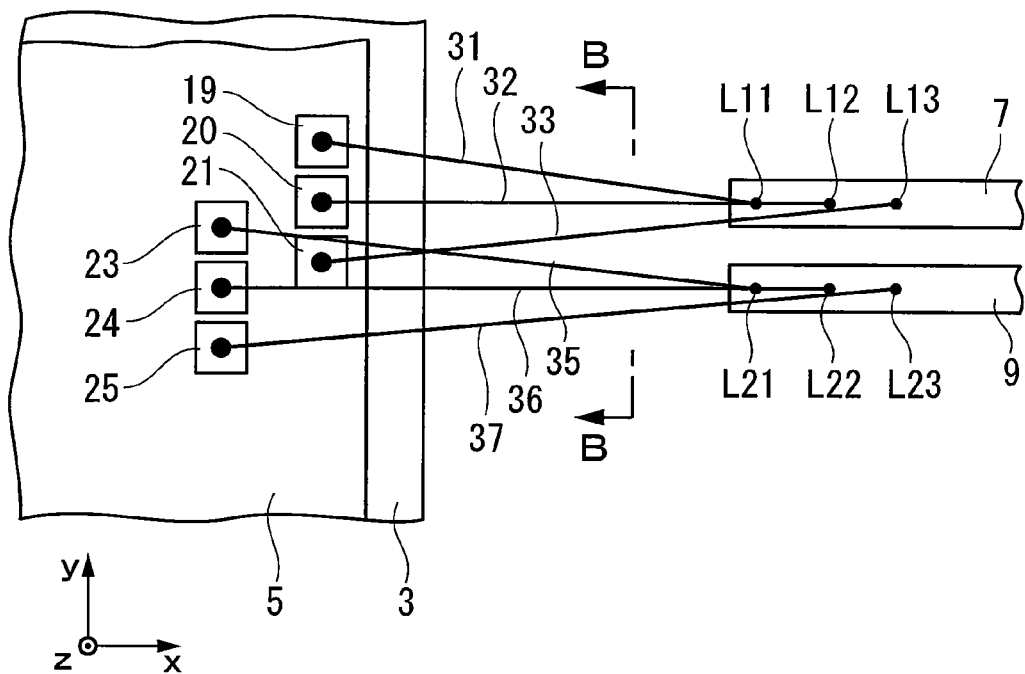
FIG. 5 is an enlarged plan view showing essential parts of a semiconductor device according to a comparative example.
Figure 6:
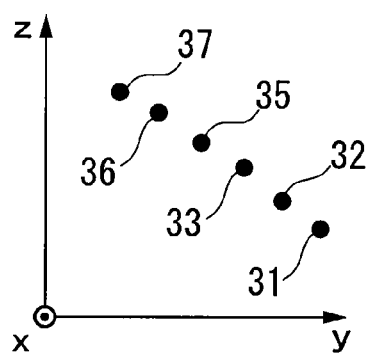
FIG. 6 is a simplified cross-sectional view taken along line B-B in FIG. 5.

The wire bonding order can be changed as shown in FIGS. 5 and 6, in which wires 31 to 33 are sequentially formed with respect to the lead 7 in connection with the electrodes 19 to 21, and wires 35 to 37 are sequentially formed with respect to the lead 9 in connection with the electrodes 23 to 25. Within the wires 31 to 33 connecting the lead 7 with the electrode pads 19 to 21 in the first line, the wire 33, which is positioned closest to the second line for aligning the electrode pads 23 to 25, is lastly formed and connected to the electrode pad 21. For this reason, the wire 33 has a highest loop height compared with the loop heights of the other wires 31 and 32 connected to the lead 7.

Within the wires 35 to 37 connecting the lead 9 with the electrode pads 23 to 25 in the second line, the wire 35, which is positioned closest to the first line for aligning the electrode pads 19 to 21, is firstly formed and connected to the electrode pad 23. For this reason, the wire 35 has a lowest loop height compared with the loop heights of the wires 36 and 37 connected to the lead 9.

Therefore, a very small gap is formed between the loop heights of the wires 33 and 35, which are positioned adjacent to each other in plan view and are connected to the leads 7 and 9 respectively.

According to the wire bonding method adapted to the semiconductor device 1, it is possible to increase the difference between the loop heights of the wires 12 and 16, which are positioned adjacent to each other in plan view and are connected to the leads 7 and 9, respectively. This makes it possible to increase the vertical distance between the wires 12 and 16 in proximity to the intersecting point S1; hence, it is possible to reliably avoid the occurrence of electric short-circuiting between the wires 12 and 16.

In the wire bonding method of the present embodiment, the wire 11 is connected to the electrode pad 19, which is farthest from the second line for aligning the electrode pads 23 to 25, and then the wire 12 is connected to the electrode pad 21; but this is not a restriction. Alternatively, the wire 12 is connected to the electrode pad 21, and then the wire 11 is connected to the electrode pad 19.

In addition, the wire 16 is connected to the electrode pad 23, which is closest to the first line for aligning the electrode pads 19 to 21, and then the wire 17 is connected to the electrode pad 25; but this is not a restriction. Alternatively, the wire 17 is connected to the electrode pad 25, and then the wire 16 is connected to the electrode pad 23.

In the semiconductor device 1, the wire 13 bonded at the distant second bond L13 of the lead 7 is connected to the electrode pad 20, which is positioned between the electrode pads 19 and 21 positioned at both ends of the first line; but this is not a restriction. Because, it is simply required that the wire 13 be connected to one of the electrode pads 19 and 20 except for the electrode pad 20 that is closest to the second line for aligning the electrode pads 23 to 25.

In addition, the wire 15 connected to the nearest second bond L21 of the lead 9 is connected to the electrode pad 24, which is positioned between the electrode pads 23 and 25 positioned at both ends of the second line; but this is not a restriction. Because, it is simply required that the wire 15 be connected to one of the electrode pads 24 and 25 except for the electrode pad 24 that is closest to the first line for aligning the electrode pads 19 to 21.

The wire bonding method of the present embodiment is designed to define the bonding positions and bonding orders with regard to the wires 11 to 13 connected to the lead 7 and the wires 15 to 17 connected to the lead 9; but this is not a restriction. Because, it is simply required that the bonding positions and bonding order be defined with respect to either the wires 11 to 13 connected to the lead 7 or the wires 15 to 17 connected to the lead 9. For example, the bonding positions and bonding order as shown in FIGS. 1 to 4 are applied to the wires 11 to 13 connected between the lead 7 and the electrode pads 19 to 21, whereas the bonding positions and bonding order as shown in FIGS. 5 and 6 are applied to the wires 15 to 17 connected between the lead 9 and the electrode pads 23 to 25.

In the present embodiment, each of the electrode pads 19 to 21 is bonded with each of the wires 11 to 13, and each of the electrode pads 23 to 25 is bonded with each of the wires 15 to 17; but this is not a restriction. For example, a single electrode pad can be bonded with three wires connected to a single lead. In this modification, each electrode pad is elongated in the alignment direction of plural leads in such a way that three wires are connected to each electrode pad at the three first bonds that are arranged in the alignment direction of plural leads.

The present embodiment is designed such that the three wires 11 to 13 are formed between the lead 7 and the three electrode pads 19 to 21, and the three wires 15 to 17 are formed between the lead 9 and the three electrode pads 23 to 25; but this is not a restriction. That is, it is possible to form four or more wires between a single lead and plural electrode pads.

2. Second Embodiment

Next, a wire bonding method according to a second embodiment of the present invention will be described with reference to FIGS. 7A to 7C, FIGS. 8A and 8B, FIGS. 9A to 9C, FIGS. 10A and 10B, and FIGS. 11A and 11B. As shown in FIGS. 7A-7C, 8A, 8B, 9A, and 9B, the wire bonding method is performed to establish electrical connection between bonding pads 101a formed on a semiconductor chip 101 mounted on a board 103 and electrode pads (or connection pads) 103a formed on the board 103 in the periphery of the semiconductor chip 101 via metal wires 105.

Figure 7A:
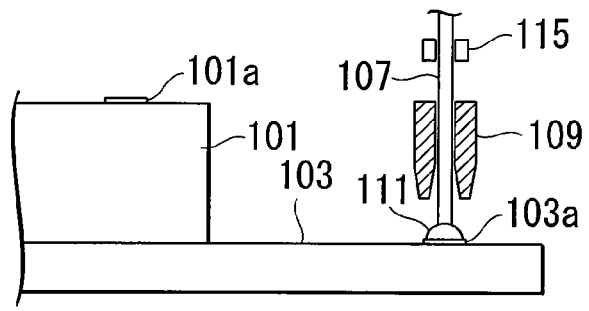
FIG. 7A is a side view partly in cross section showing a first step of a bump forming process in a wire bonding method.
Figure 7B:
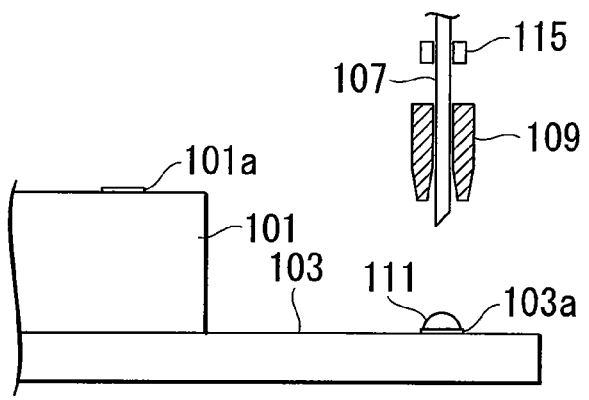
FIG. 7B is a side view partly in cross section showing a second step of the bump forming process in the wire bonding method.
Figure 7C:
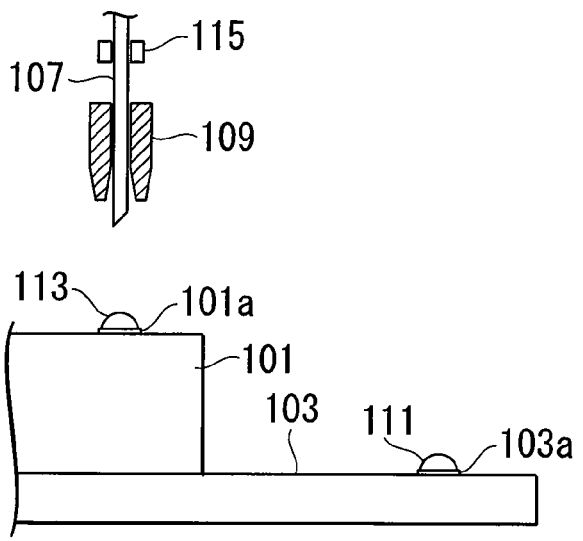
FIG. 7C is a side view partly in cross section showing a third step of the bump forming process in the wire bonding method.

As shown in FIG. 7A, the semiconductor chip 101 is mounted on the board 103 in advance so that the electrode pads 103a are formed on the board 103 in the periphery of the semiconductor chip 101. Herein, a small-diameter capillary 109 is used to supply thin wires 107 whose diameters are smaller than diameters of the metal wires 105. The terminal end of the small-diameter capillary 109 is pressed onto the electrode pad 103a so as to form a metal bump 111, and it is also pressed onto the bonding pad 101a so as to form a metal bump 113 as shown in FIGS. 7B and 7C. This is called a bump forming process in which the thin wire 107 used for the formation of the metal bumps 111 and 113 is supplied from a wire supply device (not shown) and is then introduced into a through-hole of the small-diameter capillary 109 via a wire clamp 115; that is, the thin wires 107 can be extracted from the terminal end of the small-diameter capillary 109. In this process, when heat or ultrasonic vibration is applied to the bonding pad 101a and the electrode pad 103a while the terminal end of the small-size capillary 109 is pressed onto the bonding pad 101a and the electrode pad 103a, the metal bumps 111 and 113 join the electrode pad 103a and the bonding pad 113, respectively.

The two types of the metal bumps 111 and 113 are sequentially formed in an arbitrary manner. That is, the metal bump 111 is formed on the electrode pad 103a as shown in FIG. 7B, and then the metal bump 113 is formed on the bonding pad 101a as shown in FIG. 7C. Alternatively, the metal bump 113 is formed on the bonding pad 101a, and then the metal bump 111 is formed on the electrode 103a.

In plan view, both of the metal bumps 111 and 113 attached onto the bonding pad 101a and the electrode pad 103a have substantially the same size. For example, when the small-diameter capillary 109, in which a hole diameter for the insertion of the thin wires 107 is 38 μm, and the opening diameter (or CD diameter) of the terminal end is 55 μm, is used to supply the thin wires 107 of 28 μm diameter so as to form the metal bumps 111 and 113, the minimum diameter applied to the metal bumps 111 and 113 is approximately 55 μm.

Figure 8A:
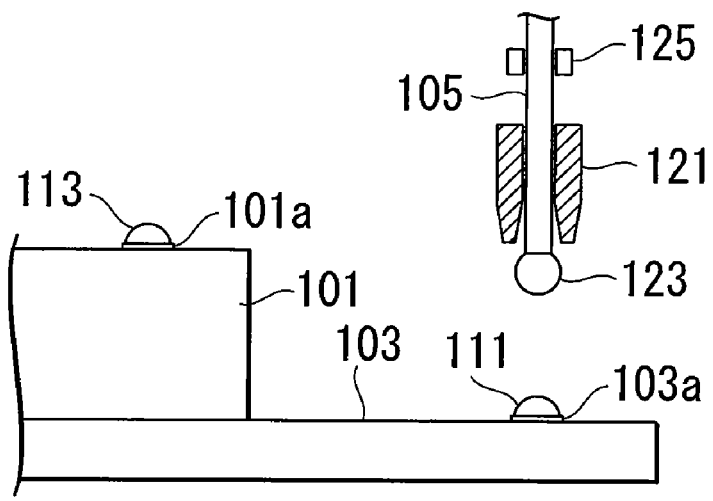
FIG. 8A is a side view partly in cross section showing a first step of a ball bonding process in the wire bonding method.
Figure 8B:
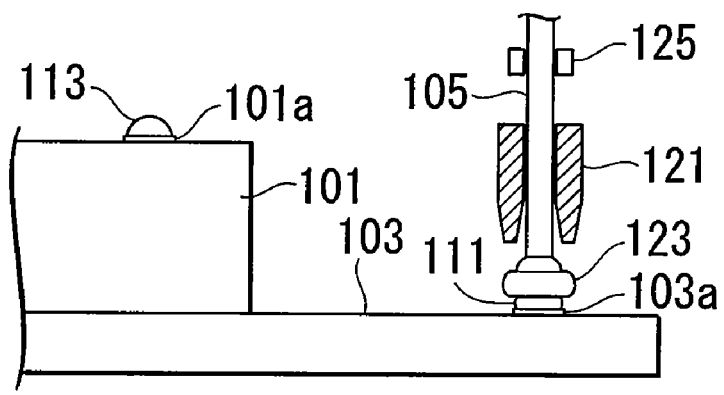
FIG. 8B is a side view partly in cross section showing a second step of the ball bonding process in the wire bonding method.

After completion of the bump forming process, the wires 105 supplied from the terminal end of a capillary 121 are melted using a hydrogen flame so that a metal ball 123 is formed at the distal end of the wire 105 as shown in FIG. 8A, and then the terminal end of the capillary 121 is pressed onto the electrode pad 103a so that the metal ball 123 joins the electrode pad 103a as shown in FIG. 8B. This is called a ball bonding process.

The aforementioned capillary 121, which is used in the ball bonding process and a wedge bonding process (which will be described later), supplies the large-diameter wire 105 whose diameter is larger than the diameter of the thin wire 107. For example, the capillary 121 has a hole diameter of 45 μm for the insertion of the wires 105 of 38 μm diameter and the CD diameter of 76 μm. Similar to the thin wires 107, the wires 105 are supplied from the wire supply device (not shown) and are then introduced into a through-hole of the capillary 121 via a wire clamp 125, so that the wire 105 is extracted from the terminal end of the capillary 121.

In the ball bonding process, the metal bump 111 is formed on the electrode pad 103a in advance; hence, the metal ball 123 joins the electrode pad 103a via the metal bump 111. Specifically, the metal ball 123 joins the metal bump 111 by way of the application of heat or ultrasonic vibration while the terminal end of the capillary 121 is pressed onto the electrode pad 103a.

When the capillary 121 and the wire 105 have the aforementioned dimensions, the minimum diameter of the metal ball 123 formed on the metal bump 111 is approximately 76 μm.

Figure 9A:
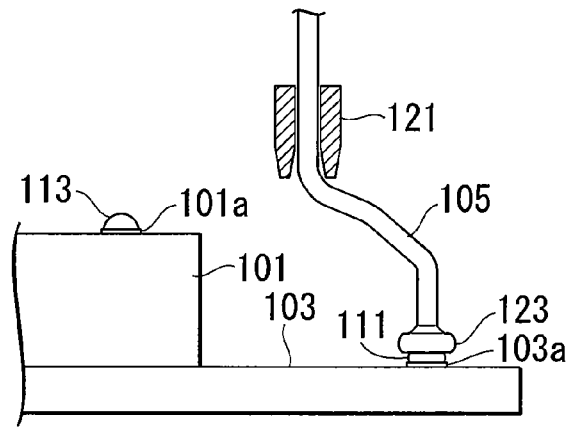
FIG. 9A is a side view partly in cross section showing a first step of a wedge bonding process in the wire bonding method.
Figure 9B:
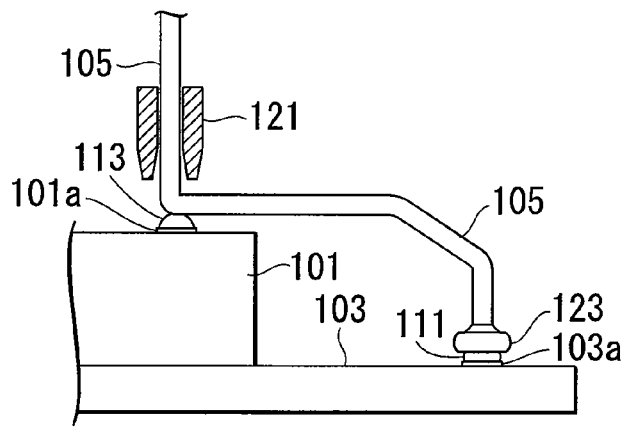
FIG. 9B is a side view partly in cross section showing a second step of the wedge bonding process in the wire bonding method.
Figure 9C:
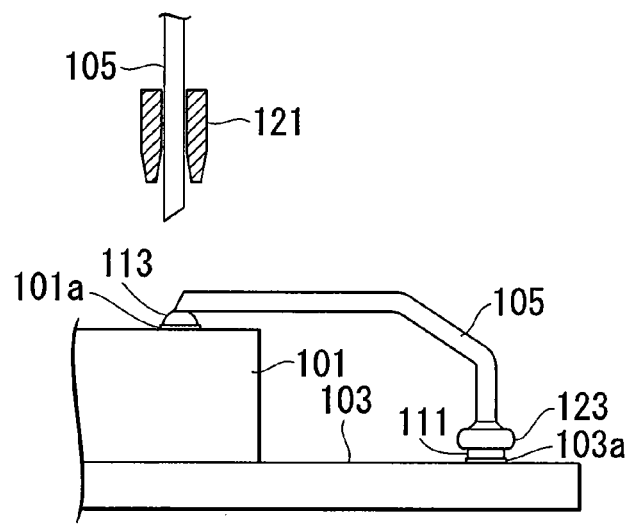
FIG. 9C is a side view partly in cross section showing a third step of the wedge bonding process in the wire bonding method.

Next, the capillary 121 is moved from the electrode pad 103a to the bonding pad 101a while continuously supplying the wire 105 from the terminal end thereof as shown in FIG. 9A. Then, as shown in FIG. 9B, the rear-end of the wire 105 is pressed onto the bonding pad 101a by means of the terminal end of the capillary 121, so that the rear-end of the wire 105 joins the metal bump 113 formed on the bonding pad 101a. This is called a wedge bonding process. In the wedge bonding process, the metal bump 113 is formed on the bonding pad 101a in advance; hence, the rear-end of the wire 105 joins the bonding pad 101a via the meal bump 113. Similar to the ball bonding process, the rear-end of the wire 105 joins the metal bump 113 by way of application of heat or ultrasonic vibration while the terminal end of the capillary 121 is pressed onto the electrode pad 103a.

After the rear-end of the wire 105 joins the metal bump 113, the wire supply device stops supplying the wire 105, and then the capillary 121 is distanced from the bonding pad 101a so as to cut the wire 105. This completes bonding of the wire 105.

Next, the electrode pad 103a, which is formed by way of the bonding method of the wire 105, and the structure of the wire 105 bonded onto the bonding pad 101a will be described in detail. In the present embodiment, the electrode pad 103a substantially has a square shape in plan view as shown in FIG. 10B, and the bonding pad 101a substantially has a square shape in plan view as shown in FIG. 11B.

Figure 10A:
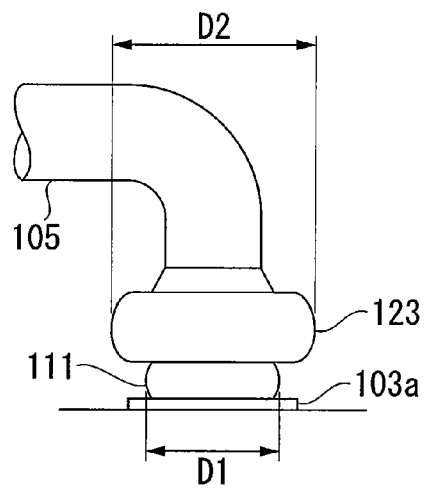
FIG. 10A is a side view showing that a metal ball of a wire is bonded onto an electrode pad via a metal bump.
Figure 10B:
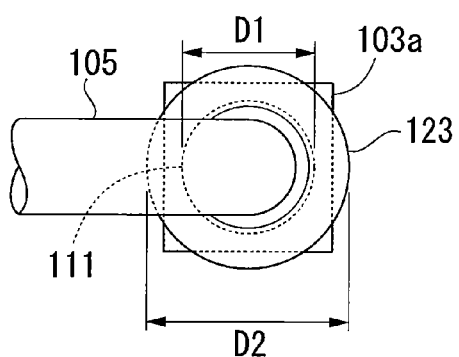
FIG. 10B is a plan view of FIG. 10A.

As shown in FIGS. 10A and 10B, the metal bump 111 and the metal ball 123 connected to the wire 105 are sequentially deposited on the electrode pad 103a, wherein the diameter of the metal bump 111 is smaller than the diameter of the metal ball 123 in a plan view of the electrode pad 103a. Herein, D1 designates the diameter of the metal bump 111 in a plan view of the electrode pad 103a, and D2 designates the diameter of the metal ball 123 joining the metal bump 111 in a plan view of the electrode pad 103a, wherein it is preferable that the relationship of $0.5 \times D2 \leq D1 < 1.2 \times D2$ be established.

When the diameter D1 of the metal bump 111 is increased 1.2 times or more larger than D2, i.e., $D1 \geq 1.2 \times D2$, it is very difficult to reduce the size of the electrode pad 103a in comparison with the structure in which the metal ball 123 directly joins the electrode pad 103a. In the structure in which the metal all 123 directly joins the electrode pad 103a so as to form a metal bump, the size of the metal bump becomes larger than the size of the metal ball 123.

When the diameter D1 of the metal bump 111 is decreased to be smaller than $1.2 \times D2$, i.e., $D1 < 1.2 \times D2$, the metal ball 123 is deviated in shape and overflows from the periphery of the metal bump 111 during the ball bonding process; this likely causes electric short-circuiting between the adjacently positioned electrode pads 103a. This causes damage on the joint portion between the metal bump 111 and the electrode pad 103a during the ball bonding process, thus reducing the joint strength; this likely causes unwanted electric conduction between the metal bump 111 and the electrode pad 103a.

Figure 11A:
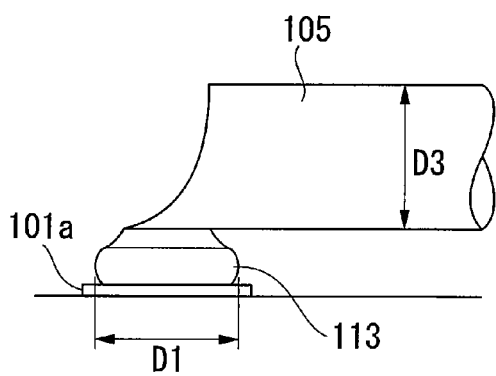
FIG. 11A is a side view showing that a rear-end of a wire is bonded onto a bonding pad via a metal bump.
Figure 11B:
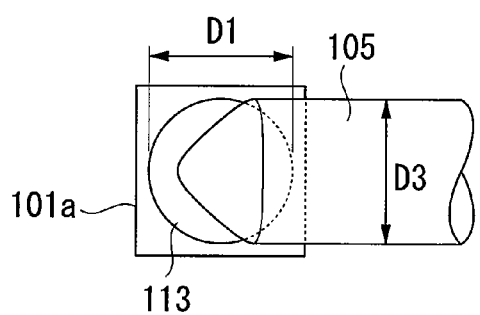
FIG. 11B is a plan view of FIG. 11A.

As shown in FIGS. 11A and 11B, the metal bump 113 and the rear-end of the wire 105 are sequentially deposited on the bonding pad 101a, wherein the diameter of the metal bump 113 is larger than the diameter of the wire 105 in a plan view of the electrode pad 103a. Herein, D1 designates the diameter of the metal bump 113, and D3 designates the diameter of the wire 105, wherein it is preferable that the relationship of $1.4 \times D3 \leq D1 < 2.0 \times D3$ be established.

When the diameter D1 of the metal bump 113 is increased to be larger than $2.0 \times D3$, the metal bump is increased in size from one formed by use of the capillary 21 arranging the wire 105. When the diameter D1 of the metal bump 113 is decreased to be smaller than $1.4 \times D3$, insufficient joint strength occurs between the rear-end of the wire 105 and the metal bump 113.

According to the wire bonding method described above, the metal ball 123 does not directly join to the electrode pad 103a, and the rear-end of the wire 105 does not directly join to the bonding pad 101a; hence, the size of the metal ball 123 does not influence the size of the electrode pad 103a, and the diameter of the wire 105 does not influence the size of the bonding pad 101a. Since the metal bumps 111 and 113 are formed by means of the small-diameter capillary 109, which is provided independently of the capillary 121 for arranging the wire 105, it is possible to reduce the sizes of the metal bumps 111 and 113 in comparison with the structure in which metal bumps are formed by means of the capillary 121. As described above, it is possible to set the sizes of the bonding pads 101a and the electrode pad 103a in conformity with the relatively small sizes of the metal bumps 111 and 113. This makes it possible to appropriately determine the sizes of the bonding pad 101a and the electrode pad 103a in conformity with the relatively small sizes of the bonding pad 101a and the electrode pad 103a. This makes it possible for the large-diameter wire 105 of the relatively large size to join the bonding pad 101a and the electrode pad 103a and the electrode pad 103a, each of which has a relatively small size.

Specifically, when the aforementioned capillary 121 is used to produce the wire 105 of 38 μm diameter so as to form a metal bump, the diameter of the metal bump is 80 μm; hence, it is necessary to form the bonding pad 101a and the electrode pad 103a each having a square shape whose length should be set to 90 μm. In contrast, when the small-diameter capillary 109 is used to produce the thin wire 107 of 28 μm diameter so as to form the metal bumps 111 and 113, each of the diameters of the metal bumps 111 and 113 can be set to 55 μm; hence, it is possible to form each of the bonding pad 101a and the electrode pad 103a in a square shape whose length can be reduced to 65 μm.

The aforementioned wire bonding method defines the diameter D1 of the metal bump 111 in accordance with the relationship of $0.5 \times D2 \leq D1 < 1.2 \times d2$, whereby it is possible to reduce the size of the electrode pad 103a in comparison with the structure in which the metal ball 123 directly joins to the electrode pad 103a, and it is possible to avoid the occurrence of electric short-circuiting.

In order to minimize the size of the electrode pad 103a, it is necessary to slightly increase the diameter D1 of the metal bump 111 (formed on the electrode pad 103a) to be identical to or greater than $0.5 \times D2$.

Since the diameter D1 of the metal bump 113 is defined in accordance with the relationship of $1.4 \times D3 \leq D1 < 2.0 \times D3$, it is possible to reliably form the metal bump 113 by means of the small-diameter capillary 109 instead of the capillary 121 for arranging the wire 105, wherein it is possible to adequately secure the joint strength between the rear-end of the wire 105 and the metal bump 113.

In order to minimize the size of the bonding pad 101a, it is necessary to slightly increase the diameter D1 of the metal bump 113 (formed on the bonding pad 101a) to be identical to or greater than $1.4 \times D3$. For example, when the diameter D3 of the wire 105 is 38 μm, it is necessary to set the diameter of the top portion of the metal bump 111 to 38 μm, wherein the diameter D1 of the metal bump 111 is set to 55 μm or so.

The present embodiment teaches that each of the bonding pad 101a and the electrode pad 103a be formed in a square shape in plan view; but this is not a restriction. The present embodiment requires that the bonding pad 101a and the electrode pad 103a be appropriately shaped to join the metal bumps 111 and 113; hence, they can be each formed in a circular shape in plan view.

The present embodiment teaches that the metal bumps 111 and 113 formed on the bonding pad 101a and the electrode pad 103a be formed using the thin wire 107 produced by the small-diameter capillary 109; but this is not a restriction. The present embodiment requires that the metal bumps 111 and 113 be formed using a thin wire whose thickness is smaller than the thickness of the wire 105 by means of a small-diameter capillary whose diameter is smaller than the diameter of the capillary 121 for arranging the wire 105. For example, it is possible to form the metal bumps 111 and 113 by use of thin wires having different diameters by means of small-diameter capillaries having different hole diameters and different CD diameters.

The present embodiment teaches that the metal bumps 111 and 113 be respectively formed on the bonding pad 101a and the electrode pad 103a in the bump forming process; but this is not a restriction. The present embodiment requires that a metal bump be formed on either the bonding pad 101a or the electrode pad 103a.

The present embodiment teaches so-called reverse bonding in which after ball bonding is performed on the electrode pads 103a of the board 103, wedge bonding is performed on the bonding pads 101a of the semiconductor chip 101; but this is not a restriction. That is, it is possible to perform bonding using the wire 105 in a normal order in which after ball bonding is performed on the bonding pads 101a, wedge bonding is performed on the electrode pads 103a.

In the aforementioned modification, metal bumps can be formed on both of the bonding pad 101a and the electrode pad 103a in the bump forming process. Alternatively, a metal bump can be formed on either the bonding pad 101a or the electrode pad 103a.

The present embodiment is applied to establish electric connection between the bonding pad 101a of the semiconductor chip 101 and the electrode pad 103a of the board 103; but this is not a restriction. This is because the present embodiment actually works when electric connection is established between the bonding pad 101a of the semiconductor chip 101 and the connection pad that is arranged in the periphery of the semiconductor chip 101. That is, the present embodiment is applicable to the establishment of any types of electric connections, in which the bonding pad 101a of the semiconductor chip 101 is electrically connected to a lead (or a connection pad) of a lead frame for mounting the semiconductor chip 101, or it is electrically connected to a bonding pad (or a connection pad) of another semiconductor chip.

3. Third Embodiment

Figure 12:
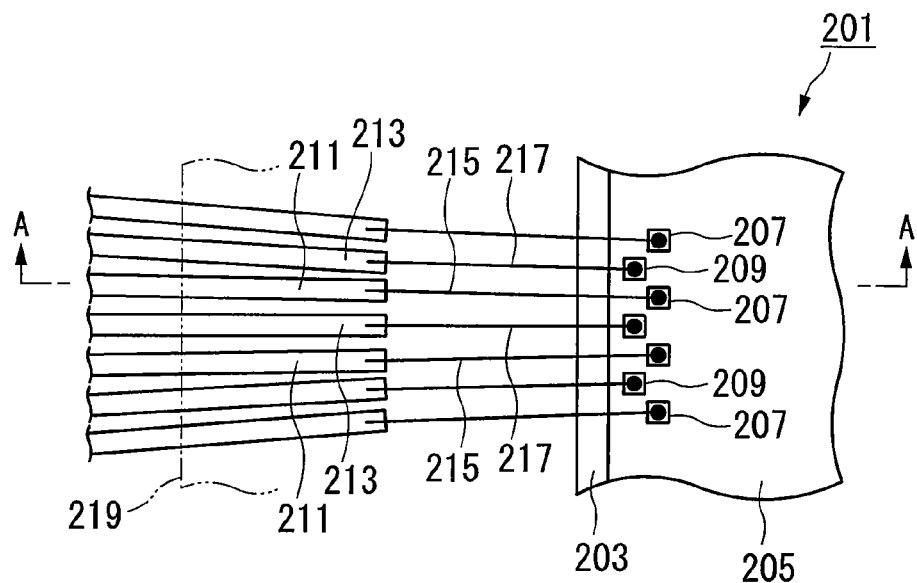
FIG. 12 is a plan view showing essential parts of a semiconductor device in accordance with a third embodiment of the present invention.
Figure 13:
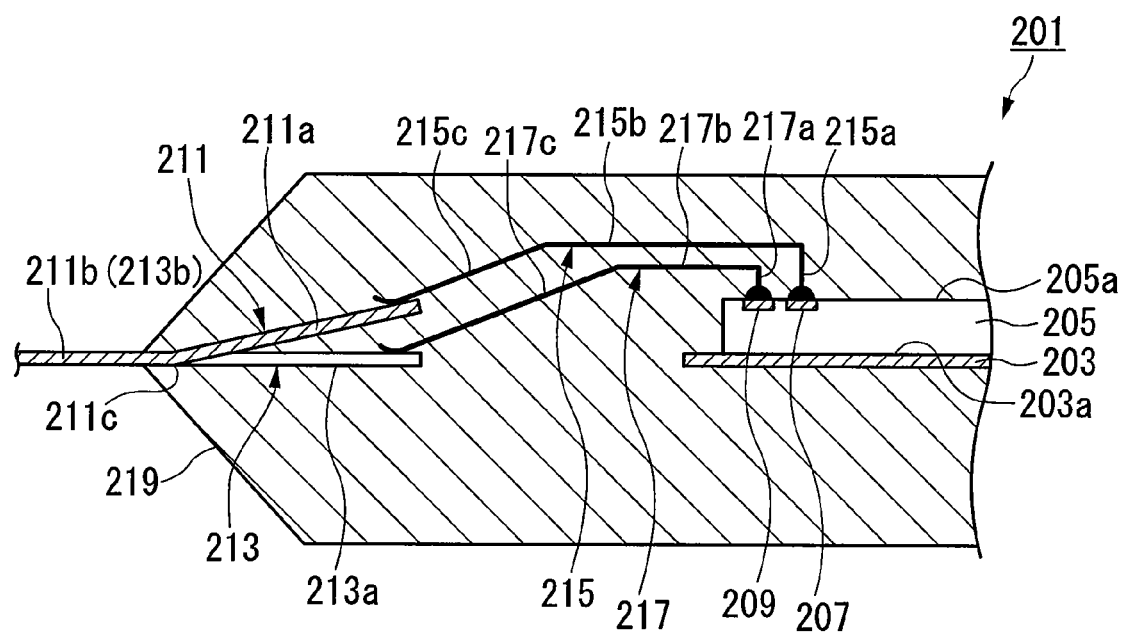
FIG. 13 is a cross-sectional view taken along line A-A in FIG. 12.
Figure 14:
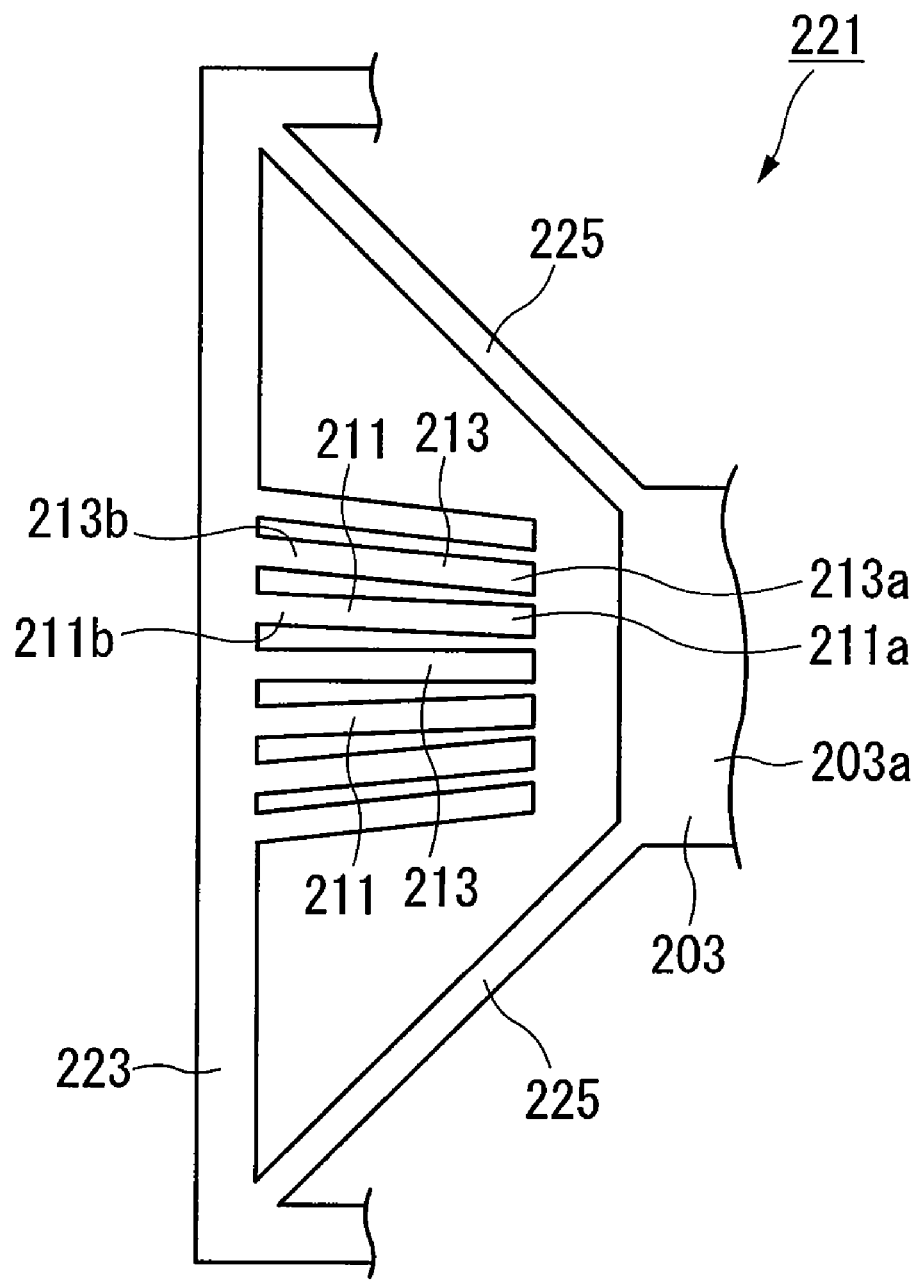
FIG. 14 is a plan view showing essential parts of a lead frame for use in manufacturing of the semiconductor device of FIG. 12.

A semiconductor device 201 according to a third embodiment of the present invention will be described with reference to FIGS. 12 to 14. As shown in FIGS. 12 and 13, a semiconductor chip 205 is mounted on a surface 203a of a stage 203 having a planar shape in plan view, wherein a plurality of electrode pads 207 and 209 are formed on a surface 205a of the semiconductor chip 205. A plurality of leads 211 and 213 are arranged in the periphery of the semiconductor chip 205, wherein they are connected to the electrode pads 207 and 209 via a plurality of wires 215 and 217.

In the semiconductor device 201, the stage 203, the semiconductor chip 205, and the wires 215 and 217 are sealed with a molded resin 219, which also integrally fixes the stage 203, the semiconductor chip 205, the leads 211 and 213, and the wires 215 and 217 in prescribed positioning.

The electrode pads 207 and 209 are alternately aligned in different lines on the surface 205a of the semiconductor chip 205 in connection with the leads 211 and 213. Specifically, the electrode pads 207 are aligned in a first line, and the electrode pads 209 are aligned in a second line that is closest to the leads 211 and 213. In short, the electrode pads 207 and 209 are aligned in a zigzag manner.

Each of the leads 211 and 213 has a thin band-like shape that is elongated toward the stage 203. Distal ends 211a and 213a of the leads 211 and 213 are positioned close to the stage 203, while base portions 211b and 213b of the leads 211 and 213 partially project externally of prescribed sides of the molded resin 219. Gaps are formed between the stage 203 and the distal ends 211a and 213a of the leads 211 and 213 and between the semiconductor chip 205 and the distal ends 211a and 213a. The distal ends 211a and 213a are aligned linearly in the alignment direction of the leads 211 and 213.

Within the leads 211 and 213 positioned adjacent to each other, the distal ends 211a of the leads 211 are bent from the base portions 211a in the thickness direction via bent portions 211c. That is, the distal end 211a of the lead 211 is bent upwardly (see FIG. 13A) from the base portion 211b in the thickness direction of the stage 203 via the bent portion 211c. The bent portions 211c of the leads 211 are positioned inside of the molded resin 219. In contrast to the leads 211, no bent portion is formed in each of the leads 213 positioned adjacent to the leads 211. The leads 211 and 213 are alternately aligned in parallel with each other.

As described above, the distal end 211a of the lead 211 is bent upwardly in the thickness direction corresponding to the thickness realized between the stage 203 and the semiconductor chip 205; hence, the distal end 211a of the lead 211 is positioned at a higher position compared with the distal end 213a of the lead 213. In addition, the distal ends 211a of the leads 211 are positioned opposite to the electrode pads 207 aligned in the first line on the surface 205a of the semiconductor chip 205, while the distal ends 213a of the leads 213 are positioned opposite to the electrode pads 209 aligned in the second line on the surface 205a of the semiconductor chip 205.

The distal ends 211a of the leads 211 are electrically connected to the electrode pads 207 via the wires 215, while the distal ends 213a of the leads 213 are electrically connected to the electrode pads 209 via the wires 217. The wires 215 and 217 are each bent upwardly in a loop shape between the distal ends 211a and 213a of the leads 211 and 213 and the electrode pads 207 and 209. Specifically, as shown in FIG. 13, the wires 215 include raised portions 215a, which vertically rise from the electrode pads 207, horizontal portions 215b, which are horizontally elongated from the raised portions 215a toward the leads 211, and inclined portions 215c, which are gradually inclined downwardly toward the distal ends 211a of the leads 211. Similarly, the wires 217 include raised portions 217a, which vertically rise from the electrode pads 209, horizontal portions 217b, which are horizontally elongated from the raised portions 217a toward the leads 213, and inclined portions 217c, which are gradually inclined downwardly toward the distal ends 213a of the leads 213.

The wires 215 are wired between the distal ends 211a of the leads 211 and the electrode pads 207 aligned in the first line, and the wires 217 are wired between the distal ends 213a of the leads 213 and the electrode pads 209 aligned in the second line.

The distance between the lead 211 and the electrode pad 207 is longer than the distance between the lead 213 and the electrode pad 209. Hence, the loop height of the wire 215 connecting the lead 211 and the electrode 207 is higher than the loop height of the wire 217 connecting the lead 213 and the electrode 209. For this reason, the raised portion 215a of the wire 215 is higher than the raised portion 217a of the wire 217 in height.

Next, a manufacturing method of the semiconductor device 201 will be described in detail.

First, there is provided a lead frame 221, which is formed using a metal thin plate so as to integrally connect the stage 203 and the leads 211 and 213 (aligned in the periphery of the stage 203). This is called a frame preparation process. The lead frame 221 includes a frame 223 that is formed integrally with the base portions 211b and 213b of the leads 211 and 213, wherein the frame 223 is interconnected to the stage 203 via a plurality of interconnection leads 225. The lead frame 221 can be produced by performing press working or etching on a thin metal plate composed of copper.

In the lead frame 221 that is formed in the frame preparation process, the distal ends 211a and 213a of the leads 211 and 213 are positioned at substantially the same height in the thickness direction of the stage 203.

Next, the semiconductor chip 205 is mounted on the surface 203a of the stage 203 in a mounting process; then, the distal ends 211a and 213a of the leads 211 and 213 are electrically connected to the electrode pads 207 and 209 via the wires 215 and 217 in a wiring process. In the mounting process, the semiconductor chip 205 is appropriately positioned such that the distal ends 211a of the leads 211 are positioned opposite to the electrode pads 207 aligned in the first line, and the distal ends 213a of the leads 213 are positioned opposite to the electrode pads 209 aligned in the second line.

In the wiring process, a ball, which is formed by melting a wire by means of a torch, is attached to the terminal end of a capillary (not shown), and then the ball is subjected to thermal compression bonding onto each of the electrode pads 207 and 209, thus forming first bonds. Next, the capillary continuously discharges a wire therefrom while it moves upwards, thus forming each of the raised portions 215a and 217a of the wires 215 and 217.

Then, the capillary is moved in a lateral direction toward each of the leads 211 and 213 such that the wire discharged therefrom is bent in a loop shape and is elongated between each of the electrode pads 207 and 209 and each of the leads 211 and 213. Thereafter, the terminal end of the capillary presses the wire onto each of the distal ends 211a and 213a of the leads 211 and 213 so as to perform thermal compression bonding, thus forming second bonds. Lastly, the capillary is moved upwards again from each of the distal ends 211a and 213a of the leads 211 and 213, thus cutting the wire.

Incidentally, it is possible to employ the conventionally-known bonding method and bonding tools, in which ultrasonic waves are used for thermal compression bonding and wire cutting, for example. In the wiring process, the lead frame 221 is mounted on the surface of a heat stage (not shown), wherein wiring is performed on the semiconductor chip 205 and the lead frame 221, which are heated by means of the heat stage.

In the wiring process, wire bonding is performed with respect to the electrode pads 207 and 209 and the leads 211 and 213 in an order in which the electrode and lead whose distance is shorter is given a first priority in wire bonding. Specifically, the electrode pads 209 aligned in the second line are firstly connected to the leads 213 via the wires 217, and then the electrode pads 207 aligned in the first line are connected to the leads 211 via the wires 215. When the wire bonding is performed in the aforementioned order, the loop heights of the wires 217 become lower than the loop heights of the wires 215.

After completion of the wiring process, the leads 211 are subjected to plastic deformation so that the distal ends 211a of the leads 211 are distanced from the distal ends 213a of the leads 213 in the thickness direction of the stage 203. This is called a lead processing process.

Figure 15A:
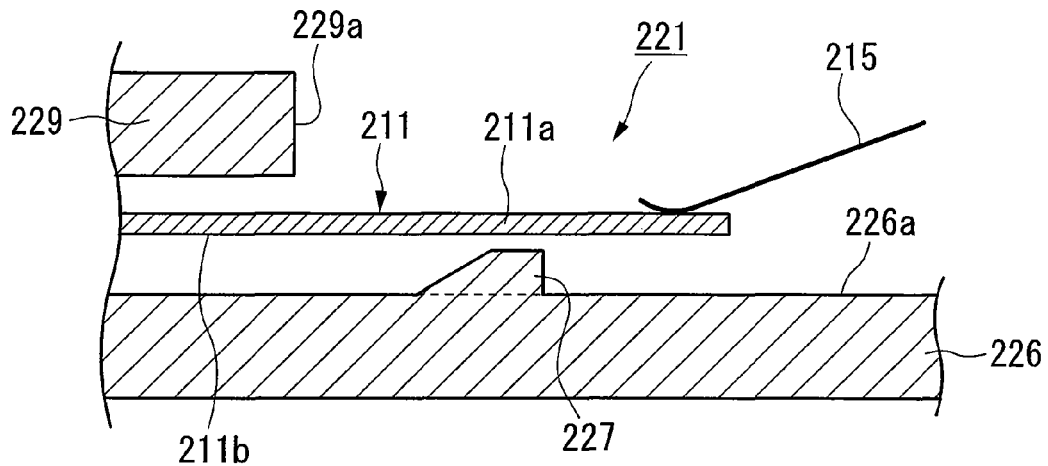
FIG. 15A is a cross-sectional view showing a first step of a lead processing process in which a distal end of a lead is bent upwards in comparison with a distal end of another lead.

The details of the lead processing process will be described with reference to FIGS. 15A to 15C. As shown in FIG. 15A, the lead frame 221 is placed between a base 226 having a plurality of projections 227 on a surface 226a and a clamper 229. The projections 227 are individually brought into contact with the distal ends 211a of the leads 211 when the lead frame 221 is placed on the surface 226a of the base 226.

Next, the lead frame 221 is placed on the base 226 in such a way that the projections 227 are positioned opposite to the leads 211. The prescribed positioning can be established between the projection 227 and the lead 211 by inserting alignment pins or positioning pins (not shown), which project from the surface 226a of the base 26, into positioning holes (not shown) formed in the frame 223 of the lead frame 221.

Figure 15B:
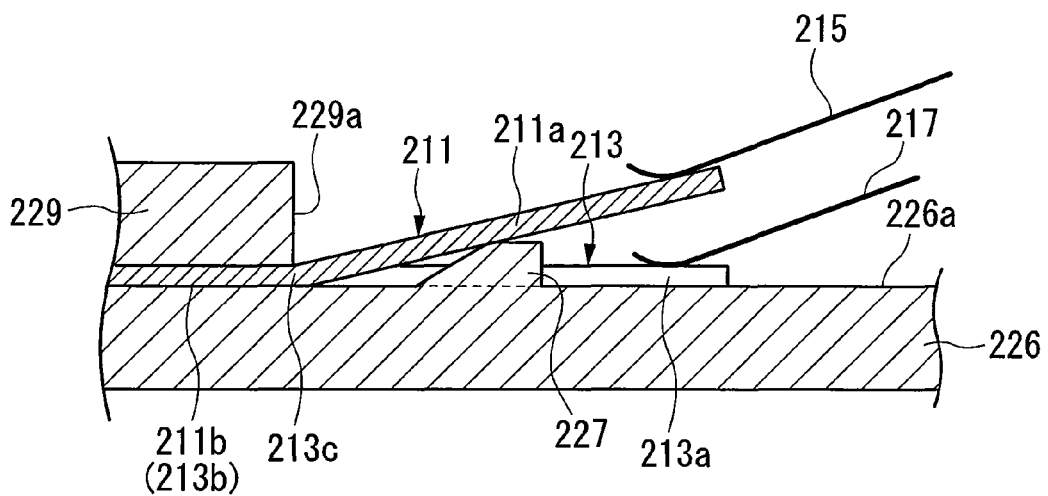
FIG. 15B is a cross-sectional view showing a second step of the lead processing process.
Figure 15C:
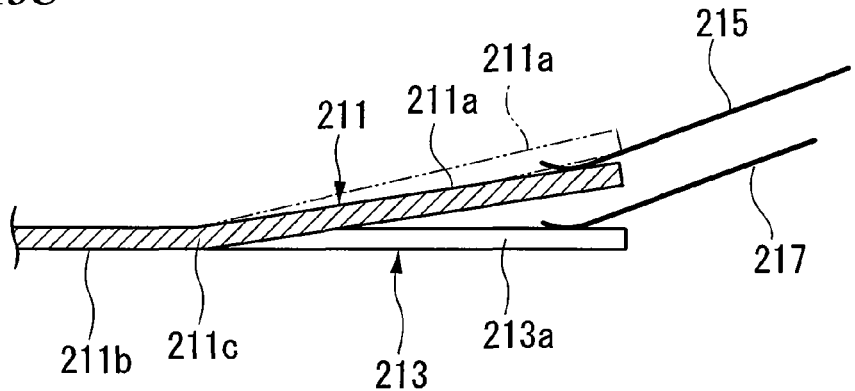
FIG. 15C is a cross-sectional view showing a third step of the lead processing process.

Then, as shown in FIG. 15B, the base portions 211b and 213b of the leads 211 and 213 are clamped between the base 226 and the clamper 229 in such a way that the distal ends 211a of the leads 211 precisely come in contact with the projections 227. A terminal portion 229a of the clamper 229 is positioned close to the base portions 211b of the leads 211 rather than the projections 227; hence, the prescribed portions of the leads 211 come in contact with the terminal portion 229a of the clamper 229 and are thus subjected to plastic deformation so as to form the bent portions 211c. That is, the distal ends 211a of the leads 211 are pressed upwards by means of the projections 227 and are thus inclined upwards in comparison with the distal ends 213a of the leads 213.

When the leads 211 are clamped between the base 226 and the clamper 229 at a high speed, the joint portions of the wires 215 joining the distal ends 211a of the leads 211 are moved at a high speed and are likely damaged. For this reason, it is preferable that the clamping speed be reduced as low as possible. The clamping speed can be reduced by reducing the moving speed of the clamper 229 or by making the projections 227 be distanced from the terminal portion 229a of the clamper 229.

The leads 211 can be bent and deformed by way of elastic deformation other than plastic deformation. When the leads 211 subjected to elastic deformation are released from clamping using the base 226 and the clamper 229, the bent portions 211c of the leads 211 are elastically restored so as to reduce the inclination angles of the distal ends 211a of the leads 211. For this reason, it is preferable that, in the lead processing process, the bent portions 211c of the leads 211 be largely bent in consideration of the elastic restoration. The inclination angles of the distal ends 211a of the leads 211 can be easily adjusted by varying the distance between the terminal portion 229a of the clamper 229 and the projections 227 or by varying the heights of the projections 227.

The aforementioned heat stage, which is used in the wiring process, can be used as the base 226. In this case, the lead frame 221 is heated so that the bent portions 211c of the leads 211 are subjected to plastic deformation with ease; hence, it is possible to suppress the elastic restoration.

When the heat stage is used as the base 226, the wiring process is performed so as not to cause interference between the leads 211 and 213 and the projections 227 when the lead frame 221 is clamped between the base 226 and the clamper 229; then, the lead processing process is performed by moving the clamper 229 and the lead frame 221 relative to the base 226 while the clamped state is maintained in such a way that the distal ends 211a of the leads 211 run upon the projections 227. In this case, it is possible to suppress the elastic restoration.

It is possible to employ another method for suppressing elastic deformation. For example, in the frame preparation process, the bent portions 211c of the leads 211 are reduced in thickness in advance in comparison with other portions of the leads 211 by way of etching.

After completion of the lead processing process, the lead frame 221 is arranged in a metal mold (not shown), into which a melted resin is injected so as to form the molded resin 219 for integrally fixing the stage 203, the semiconductor chip 205, the leads 211 and 213, and the wires 215 and 217.

The molded resin 219 is formed to seal the stage 203, the semiconductor chip 205, the wires 215 and 217, and the leads 211 and 213 except for prescribed parts of the base portions 211b and 213b. That is, the distal ends 211a and 213a of the leads 211 and 213 as well as the bent portions 211c of the leads 211 are sealed inside of the molded resin 219.

Lastly, the frame 223 and the interconnection leads 225 of the lead frame 221, which project externally of the side portions of the molded resin 219, are cut out so as to complete production of the semiconductor device 201 in which the leads 211 and 213 are electrically independent from each other.

According to the present invention, the semiconductor device 201 is designed such that the end portion of the wire 215 joining the distal end 211a of the lead 211 is distanced from the end portion of the wire 217 joining the distal end 213a of the lead 213 in the thickness direction of the stage 203. For this reason, even when a relatively small distance lies between the wires 215 and 217 adjoining each other in proximity to the distal ends 211a and 213a of the leads 211 and 213, it is possible to reliably prevent the wires 215 and 217 from coming in contact with each other in proximity to the distal ends 211a and 213a of the leads 211 and 213; hence, it is possible to easily avoid the occurrence of electric short-circuiting between the wires 215 and 217.

Due to the formation of the bent portion 211c of the lead 211 in the lead processing process, the distal end 211a of the lead 211 can be reliably distanced from the distal end 213a of the lead 213 in the thickness direction of the stage 203.

The manufacturing method of the present embodiment is designed such that the wiring process is performed before the lead processing process; hence, in the wiring process, the distal ends 211a and 213a of the leads 211 and 213 are firstly positioned substantially at the same height in the thickness direction of the stage 203. This makes it possible to easily perform wire bonding using a capillary.

In the lead processing process that is performed after the wiring process, the distal ends 211a and 213a of the leads 211 and 213 are simply distanced from each other in the thickness direction of the stage 203; this makes it possible to easily increase the difference between the loop heights of the wires 215 and 217 joining the leads 211 and 213.

The present embodiment is designed such that the lead processing process is performed after the wiring process; but this is not a restriction. That is, the lead processing process can be performed before the wiring process. In this case, the lead processing process can be performed simultaneously with the press working in the frame preparation process. Even when the lead processing process is performed simultaneously with the frame preparation process, it is possible to form the lead frame 221 in which the distal ends 211a and 213a of the leads 211 and 213, which adjoin each other, are distanced from each other in the thickness direction of the stage 203.

When the wiring process is performed after the lead processing process, the wiring process is performed in the condition in which the distal ends 211a and 213a of the leads 211 and 213 are mutually distanced from each other in the thickness direction of the stage 203. This processing differs from the present embodiment in that the distal ends 211a of the leads 211 are not necessarily moved after the wiring process; hence, it is possible to protect the joint portions between the leads 211 and the wires 215. This improves the reliability in establishing electric connection between the leads 211 and the semiconductor chip 205.

When the wiring process is performed after the lead processing process, it is possible to perform an elastic deformation process between the lead processing process and the wiring process. In the elastic deformation process, the leads 211 are subjected to elastic deformation so that the distal ends 211a and 213a of the leads 211 and 213 adjoining each other are positioned substantially at the same height in the thickness direction of the stage 203. In addition, it is possible to perform a restoration process after the wiring process. In the restoration process, the leads 211 are released from elastic deformation, so that the leads 211 are restored such that the distal ends 211a thereof are distanced from the distal ends 213a of the leads 213.

Figure 16A:
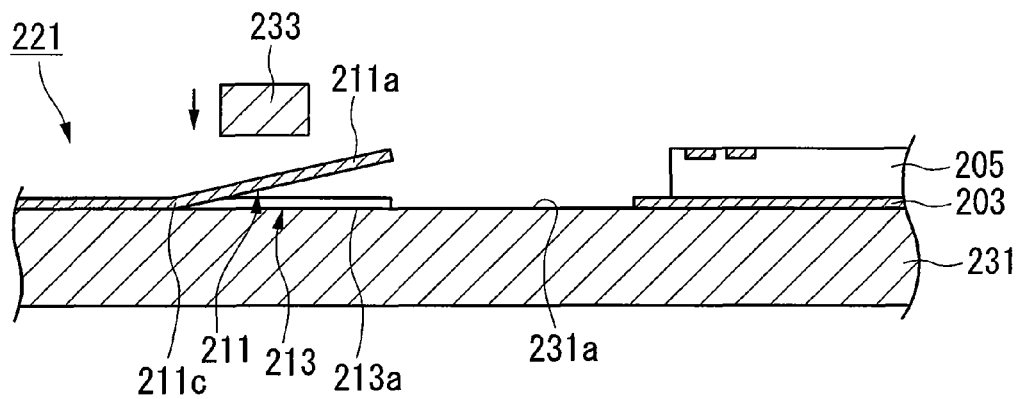
FIG. 16A is a cross-sectional view showing an elastic deformation process adapted to the manufacturing method of the semiconductor device.
Figure 16B:
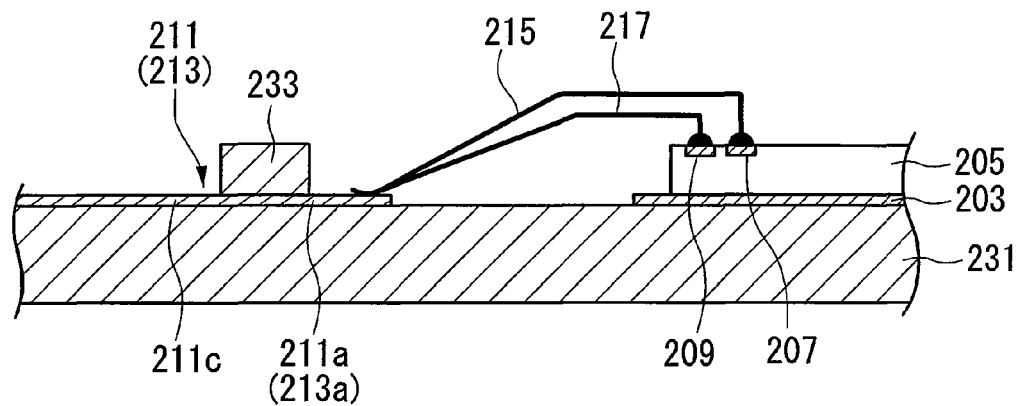
FIG. 16B is a cross-sectional view showing a wiring process adapted to the manufacturing method of the semiconductor device.
Figure 16C:
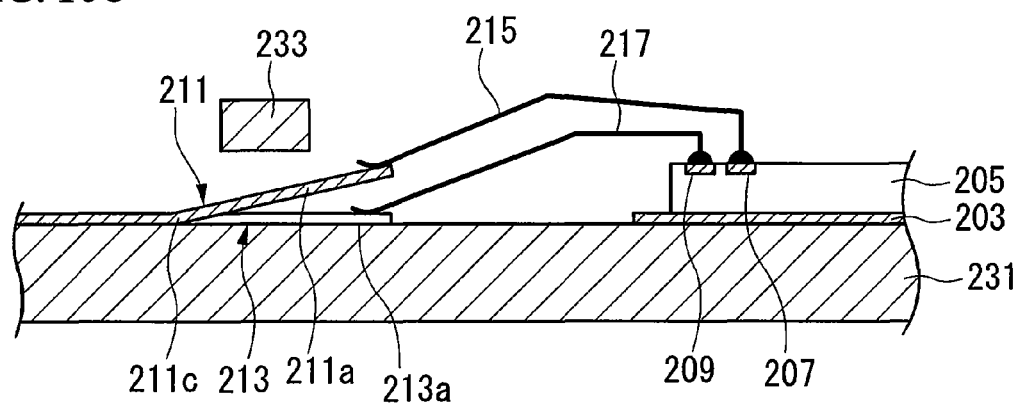
FIG. 16C is a cross-sectional view showing a restoration process adapted to the manufacturing method of the semiconductor device.

Specifically, in the elastic deformation process as shown in FIGS. 16A and 16B, the lead frame 221 is mounted on the surface 231a of the heat stage 231; a clamper 233 is pressed downwardly onto the distal ends 211a and 213a of the leads 211 and 213; thus, the distal ends 211a and 213a of the leads 211 and 213 are clamped between the heat stage 231 and 233. Herein, the clamper 233 is designed so as to press the joint portions between the distal ends 211a and 213a of the leads 211 and 213 and the wires 215 and 217 as well as the bent portions 211c of the leads 211. Next, the wiring process is performed in the clamped condition in which the leads 211 and 213 are clamped between the heat stage 231 and the clamper 233. As shown in FIG. 16C, in the restoration process after the wiring process, the clamper 233 is moved upwards so as to release the leads 211 from the elastic deformation.

The aforementioned manufacturing method offers effects similar to those of the present embodiment.

In the present embodiment, wire bonding is performed in the wiring process in such a way that the loop heights of the wires 217 become lower than the loop heights of the wires 215. Instead, when the lead processing process and restoration process are performed after the wiring process, the loop heights of the wires 217 become identical to the loop heights of the wires 215. In this case, due to the lead processing process after the wiring process, the distal ends 211a and 213a of the leads 211 and 213 adjoining each other are distanced from each other in the thickness direction of the stage 203; hence, it is possible to realize prescribed differences between the loop heights of the wires 215 and 217. Herein, wire bonding can be simplified by arranging the wires 215 and 217 both having the same loop shape with respect to the leads 211 and 213 in the wiring process.

The present embodiment teaches that, in the lead processing process, the leads 211 are partially bent when they are clamped between the clamper 229 and the base 226 in which the projections 227 are formed on the surface 226a; but this is not a restriction. For example, as shown in FIGS. 17A to 17C, the base portions 211b and 213b of the leads 211 and 213 are clamped between a base 235 and a clamper 237, and then the intermediate portions of the leads 211 are compressed so that the distal ends 211a of the leads 211 are inclined with respect to the leads 213.

Figure 17A:
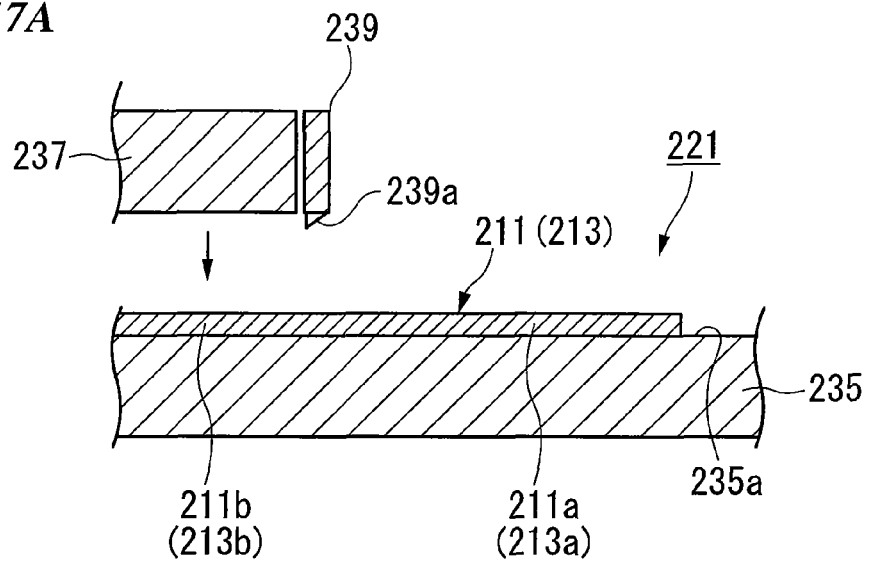
FIG. 17A is a cross-sectional view showing a first step of a lead processing process that is modified in comparison with the lead processing process shown in FIGS. 15A to 15C.
Figure 17B:
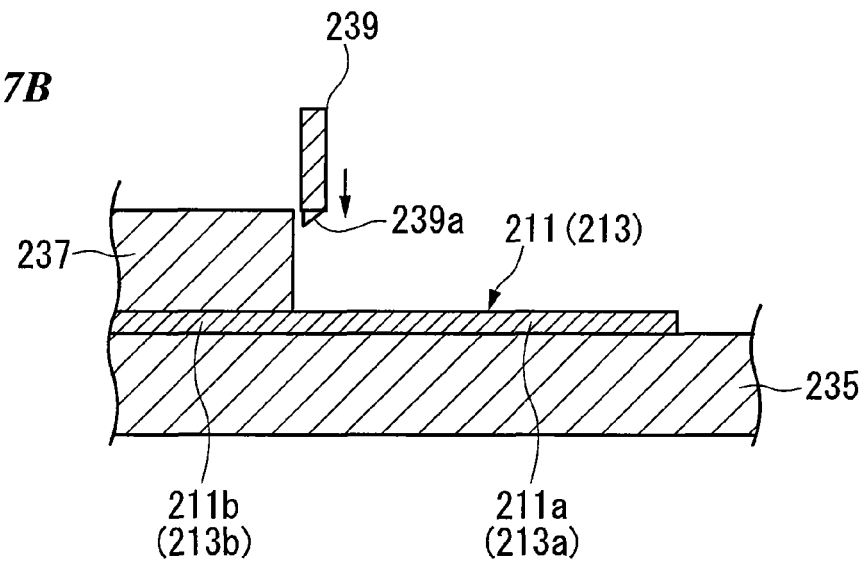
FIG. 17B is a cross-sectional view showing a second step of the lead processing process.

The aforementioned processing is realized in such a way that, as shown in FIG. 17A, the lead frame 221 is mounted on a surface 235a of the base 235; then, as shown in FIG. 17B, the clamper 237 is pressed downwardly onto the base portions 211b and 213b of the leads 211 and 213, which are thus clamped between the base 235 and the clamper 237. A compressor 239 having sharp projections 239a, which project downwardly towards the leads 211, is arranged adjacent to the clamper 237 in proximity to the distal ends 211a and 213a of the leads 211 and 213. The projections 239a are aligned in a comb-like manner so as to face only the leads 211, which are aligned alternately with the leads 213.

Figure 17C:
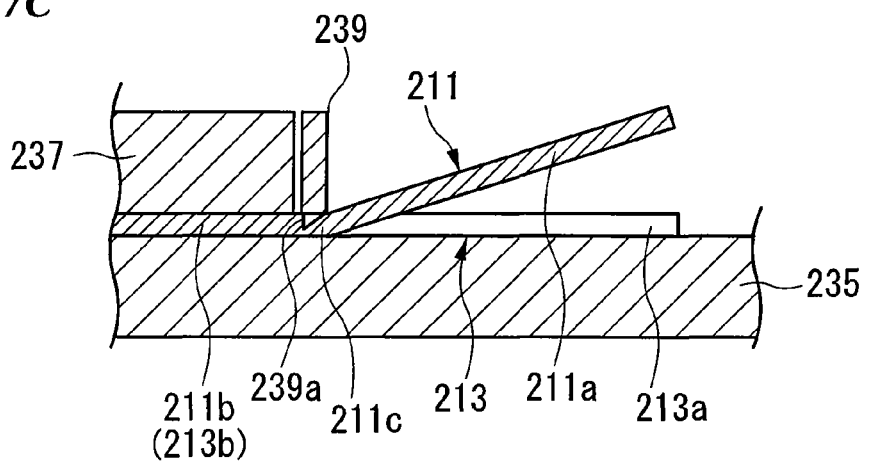
FIG. 17C is a cross-sectional view showing a third step of the lead processing process.

In the clamped condition in which the base portions 211b and 213b of the leads 211 and 213 are clamped between the base 235 and the clamper 237, as shown in FIG. 17C, the projections 239a of the compressor 239 are pressed towards the prescribed portions of the leads 211 in proximity to the clamper 237. At this time, the pressed portions (or compressed portions) of the leads 211, which are compressed by the projections 239a, are contracted and are then bent, so that the distal ends 211a of the leads 211, which are not pressed by the clamper 237, are moved upwardly and are thus inclined with respect to the distal ends 213a of the leads 213. Due to the aforementioned processing for bending the leads 211, it is possible to prevent the bent portions 211c of the leads 211 from being subjected to elastic restoration after the clamper 237 and the compressor 239 are separated from the leads 211.

The lead processing process is not necessarily limited to use of the base 235, the clamper 237, and the compressor 239. It simply requires that the distal ends 211a of the leads 211 be bent and inclined with respect to the base portions 211b.

The present embodiment teaches that the distal ends 211a of the leads 211 are positioned higher than the distal ends 213a of the leads 213; but this is not a restriction. Because, it is simply required that the distal ends 211a and 213a of the leads 211 and 213 be mutually distanced from each other in the thickness direction of the stage 203.

As described above, the third embodiment can be further modified in a variety of ways; hence, variations of the third embodiment will be described below.

(a) First Variation

Figure 18:
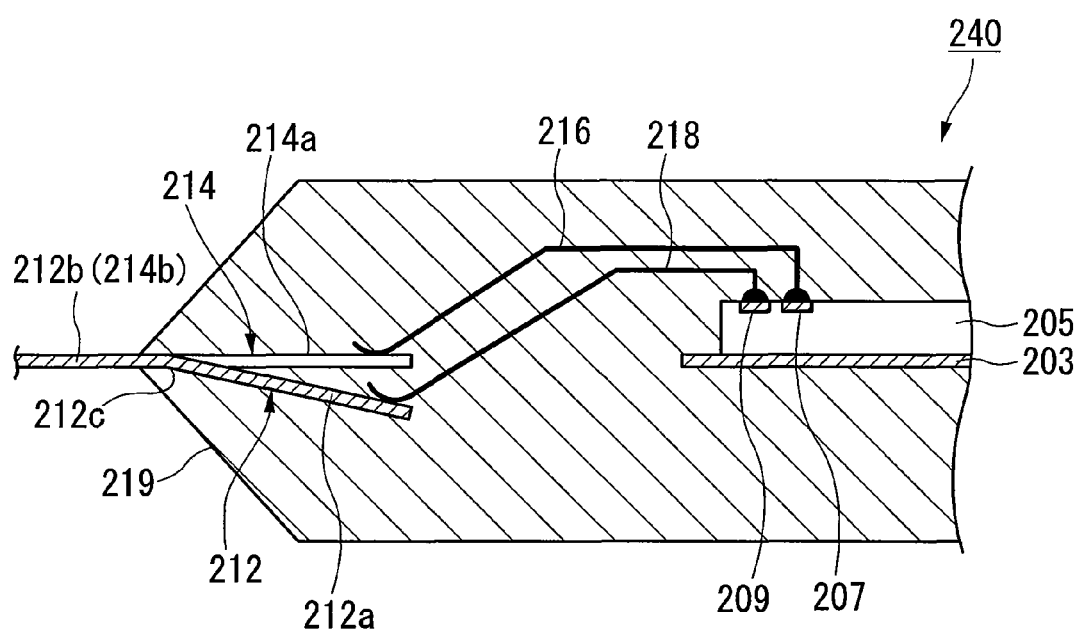
FIG. 18 is a cross-sectional view showing essential parts of a semiconductor device according to a first variation of the third embodiment.

FIG. 18 shows a semiconductor device 240 in accordance with a first variation of the third embodiment, wherein distal ends 212a of leads 212 adjoining leads 214 are bent downwardly from the semiconductor chip 205 in the thickness direction of the stage 203 and are thus positioned lower than distal ends 214a of the leads 214.

In the above, the distal ends 212a of the leads 212 are positioned opposite to the electrode pads 209 aligned in the second line, and the distal ends 214a of the leads 214 are positioned opposite to the electrode pads 207 aligned in the first line. Herein, the loop heights of wires 216 connecting the electrode pads 207 to the leads 214 are higher than the loop heights of wires 218 connecting the electrode pads 209 to the leads 212.

According to the manufacturing method of the semiconductor device 240 shown in FIG. 18, in the wiring process, the electrodes 209 aligned in the second line are connected to the leads 212 via the wires 218, and then the electrodes 207 aligned in the first line are connected to the leads 214 via the wires 216.

Figure 19A:
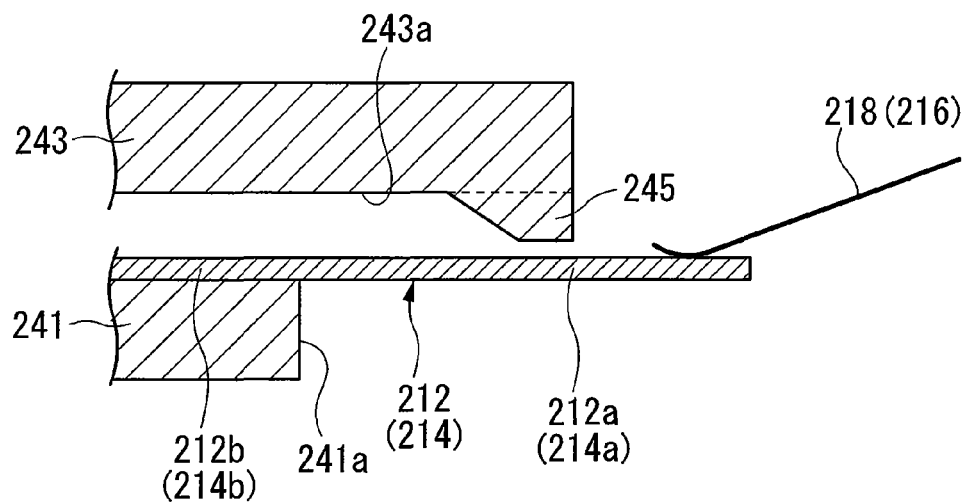
FIG. 19A is a cross-sectional view showing a first step of a lead processing process adapted to the semiconductor device shown in FIG. 18.

In the lead processing process, as shown in FIG. 19A, there are provided in advance a base 241 and a clamper 243. Base portions 212b of the leads 212 and base portions 214b of the leads 214 are arranged on the surface of the base 241 and are then subjected to clamping using the clamper 243. Herein, the clamper 243 is elongated so as to be longer than the base 241 toward the distal ends 212a and 214a of the leads 212 and 214. Projections 245 are formed on an interior surface 243a of the clamper 243 positioned opposite to the distal ends 212a and 214a of the leads 212 and 214. Specifically, the projections 245 project downwardly toward the distal ends 212a of the leads 212.

Figure 19B:
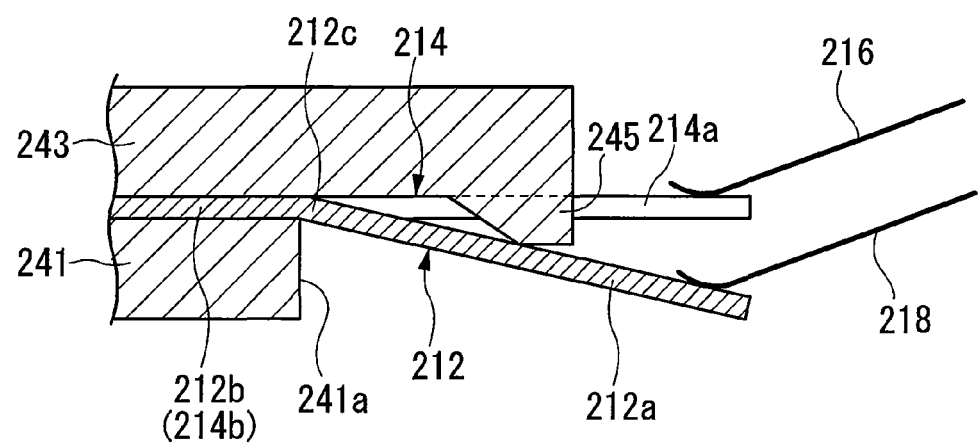
FIG. 19B is a cross-sectional view showing a second step of the lead processing process adapted to the semiconductor device shown in FIG. 18.

Next, as shown in FIG. 19B, the base portions 212b and 214b of the leads 212 and 214 are clamped between the base 241 and the clamper 243 so that the distal ends 212a of the leads 212 come in contact with the projections 245. A terminal portion 241a of the base 241 is positioned close to the base portions 212b of the leads 212 in comparison with the projections 245; hence, prescribed portions (i.e., bent portions 212c) of the leads 212, which come in contact with the terminal portion 241a of the base 241, are bent downwardly due to elastic deformation. Thus, the distal ends 212a of the leads 212 are pressed downwardly by means of the projections 245, so that they are inclined with respect to the distal ends 214a of the leads 214.

In the manufacturing of the semiconductor device 240, which may be similar to the manufacturing of the semiconductor device 201, it is possible to perform the lead processing process after the wiring process, or it is possible to perform the wiring process after the lead processing process. In addition, the manufacturing method of the semiconductor device 240 can include the aforementioned elastic deformation process and restoration process. When the lead processing process is performed after the wiring process, it is necessary to pay attention to the clamping speed for clamping the leads 212 between the base 241 and the clamper 243 in such a way that the clamping speed does not become too fast.

In the semiconductor devices 201 and 240, the distal ends 211a and 212a of the leads 211 and 212 are inclined upwardly or downwardly; but this is not a restriction. Alternatively, it is possible to make the distal ends 213a and 214a of the other leads 213 and 214 be reversely inclined with respect to the distal ends 211a and 212a of the leads 211 and 212.

(b) Second Variation

A semiconductor device 251 according to a second variation of the third embodiment will be described with reference to FIGS. 20 and 21, in which parts identical to those of the semiconductor device 201 are designated by the same reference numerals; hence, the description thereof will be omitted.

Figure 20:
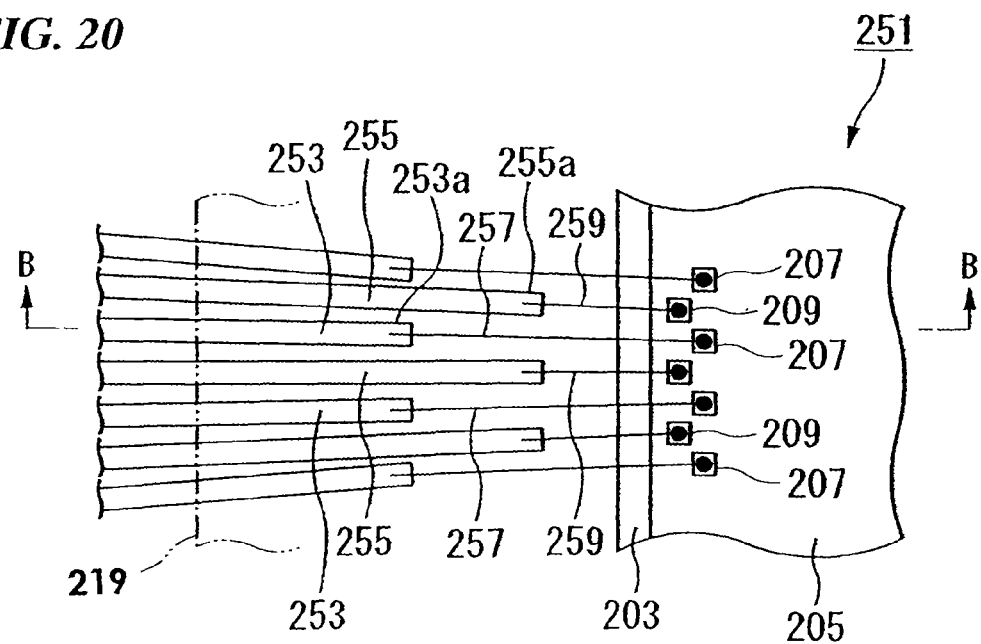
FIG. 20 is a plan view showing essential parts of a semiconductor device according to a second variation of the third embodiment.
Figure 21:
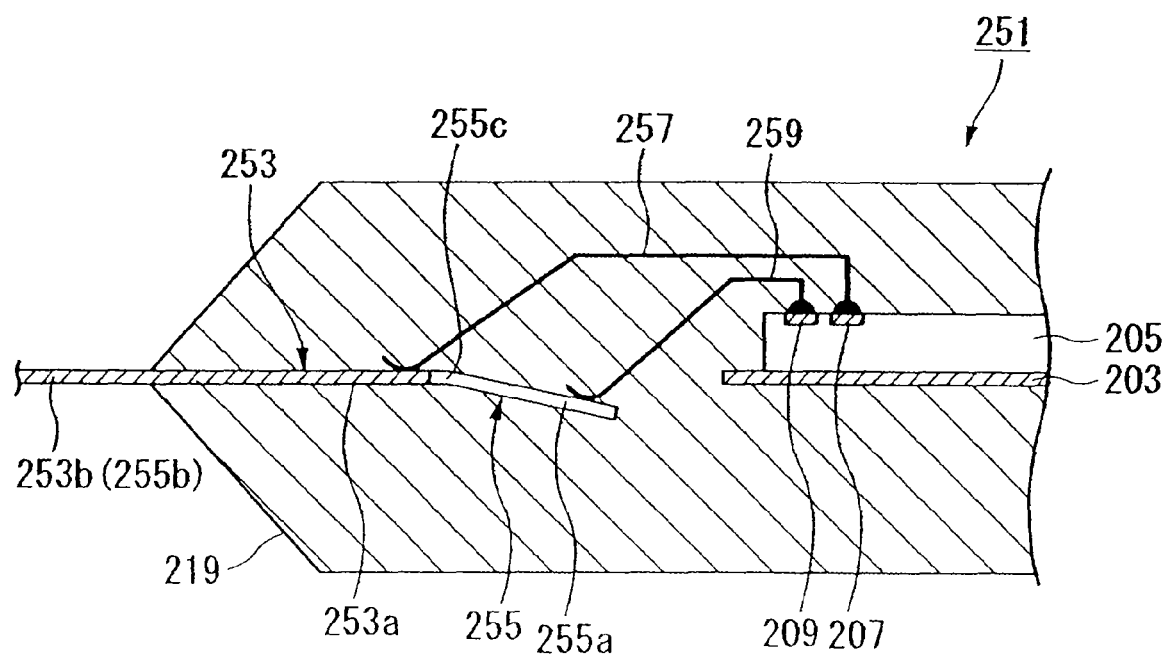
FIG. 21 is a cross-sectional view taken along line B-B in FIG. 20.

As shown in FIGS. 20 and 21, the semiconductor device 251 includes leads 253 and 255, which are adjoined together, wherein distal ends 255a of the leads 255 are positioned lower than distal ends 253a of the leads 253 in the thickness direction of the stage 203. The distal ends 253a of the leads 253 are distanced from the semiconductor chip 205 in comparison with the distal ends 255a of the leads 255.

Specifically, the leads 253 are shorter than the leads 255, and the leads 255 include bent portions 255c by which the distal ends 255a are bent downwardly in the thickness direction of the stage 203 in comparison with base portions 255b. In addition, the bent portions 255c of the leads 255 are positioned close to the semiconductor chip 205 in comparison with the distal ends 253a of the leads 253. In short, the bent portions 255c of the leads 255 are positioned so as not to overlap with the leads 253 in view of the alignment of the leads 253 and 255.

No bent portion is formed in each of the leads 253; hence, both of the distal ends 253a and base portions 253b are positioned at substantially the same height. The leads 253 and 255 are aligned alternately in a horizontal direction. In other words, the distal ends 253a and 255a of the leads 253 and 255 are aligned in a zigzag manner.

The distal ends 253a of the leads 253 are positioned opposite to the electrode pads 207 aligned in the first line, and the distal ends 255a of the leads 255 are positioned opposite to the electrode pads 209 aligned in the second line.

The distal ends 253a of the leads 253 join the electrode pads 207 via wires 257, and the distal ends 255a of the leads 255 join the electrode pads 209 via wires 259. The wires 257 are each curved upwardly in a loop shape between the distal ends 253a of the leads 253 and the electrode pads 207, and the wires 259 are each curved upwardly in a loop shape between the distal ends 255a of the leads 255 and the electrode pads 209.

The distance between the distal end 253a of the lead 253 and the electrode pad 207 is longer than the distance between the distal end 255a of the lead 255 and the electrode pad 209; hence, the loop height of the wire 257 connecting the distal end 253a of the lead 253 and the electrode pad 207 is higher than the loop height of the wire 259 connecting the distal end 255a of the lead 255 and the electrode pad 209.

Similar to the manufacturing method of the semiconductor device 201, the manufacturing method of the semiconductor device 251 includes the frame preparation process, installation process, wiring process, lead processing process, and mold process. The semiconductor device 251 can be produced even when the lead processing process is performed before the wiring process. In addition, the manufacturing process of the semiconductor device 251 can include the aforementioned elastic deformation process and restoration process.

The manufacturing method of the semiconductor device 251 demonstrates effects similar to those of the manufacturing method of the semiconductor device 201.

In the semiconductor device 251, the distal ends 253a of the lead 253 are distanced from the distal ends 255a of the leads 255 in both of the thickness direction and elongation direction of the leads 253 and 255. This makes it possible to further increase the distances between the joint portions of the wires 257 and 259, which join the distal ends 253a and 255a of the leads 253 and 255. Hence, it is possible to reliably prevent the wires 257 and 259 from unexpectedly coming in contact with each other in proximity to the distal ends 253a and 255a of the leads 253 and 255.

In addition, the distal ends 255a of the leads 255 positioned close to the semiconductor chip 205 are positioned lower than the distal ends 253a of the leads 253. This further increases the differences of loop heights between the wires 257 and 259, which join the leads 253 and 255, respectively.

(c) Third variation

Figure 22:
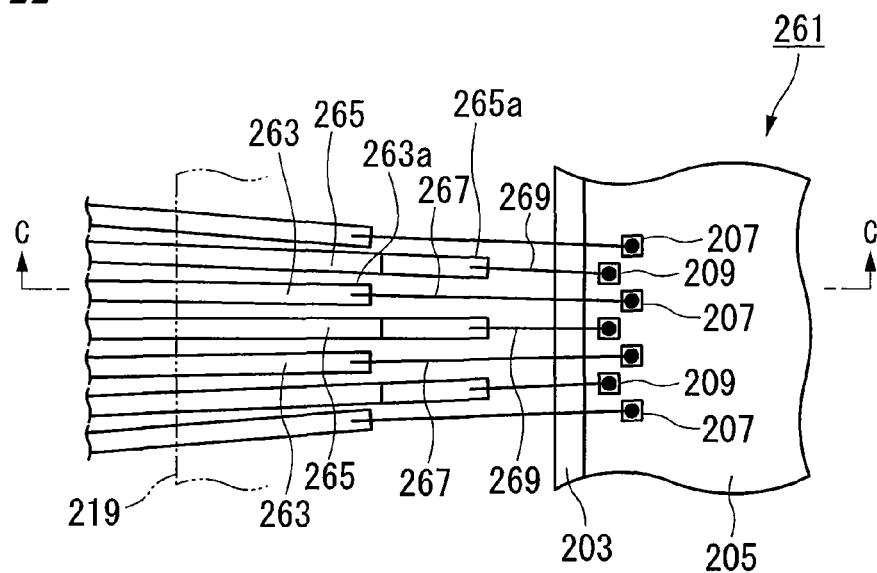
FIG. 22 is a plan view showing essential parts of a semiconductor device according to a third variation of the third embodiment.
Figure 23:
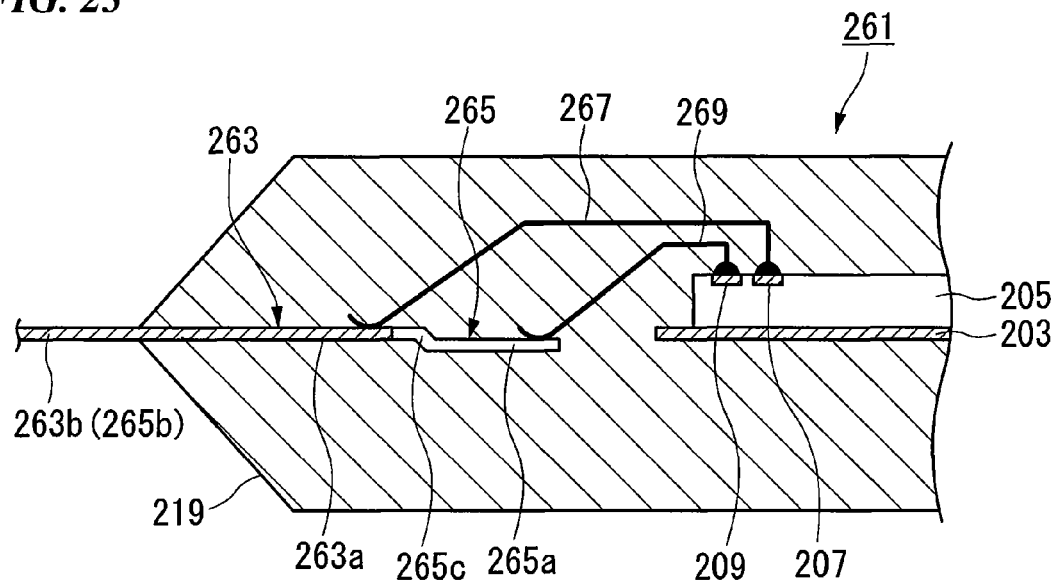
FIG. 23 is a cross-sectional view taken along line C-C in FIG. 22.

A semiconductor device 261 according to a third variation of the third embodiment will be described with reference to FIGS. 22 and 23, wherein parts identical to those of the semiconductor device 251 are designated by the same reference numerals; hence, the description thereof will be omitted.

Similar to the semiconductor device 251, the semiconductor device 261 is designed such that leads 263 are shorter than leads 265, wherein distal ends 263a of the leads 263 are distanced from the semiconductor chip 205 in comparison with distal ends 265a of the leads 265.

The leads 265 include step portions 265c for interconnecting the distal ends 265a to base portions 265b in a step-like manner. Hence, the distal ends 265a of the leads 265 are positioned lower than the distal ends 263a of the leads 263 in the thickness direction. In the semiconductor chip 261, the distal ends 263a of the leads 263 are positioned substantially in parallel with the distal ends 265a of the leads 265.

The step portions 265c of the leads 265 are positioned close to the semiconductor chip 205 in comparison with the distal ends 263a of the leads 263. That is, the step portions 265c of the leads 265 are positioned so as not to overlap with the leads 263 in view of the alignment direction of the leads 263 and 265. No step portion is formed in each of the leads 263; hence, both of the distal ends 263a and base portions 263b are positioned substantially at the same height.

Similar to the semiconductor device 251, the loop heights of wires 267 for connecting the distal ends 263a of the leads 263 and the electrode pads 207 aligned in the first line are higher than the loop heights of wires 269 for connecting the distal ends 265a of the leads 265 and the electrode pads 209 aligned in the second line.

Similar to the semiconductor devices 201, 240, and 251, the semiconductor device 261 is manufactured by sequentially performing the frame preparation process, installation process, wiring process, and mold process. In the period between the frame preparation process and the wiring process, it is necessary to perform the lead processing process in which the leads 265 are subjected to elastic deformation so as to form the step portions 265c.

In the lead processing process, the leads 265 are subjected to press working so as to form the step portions 265c. For this reason, the lead processing process can be performed simultaneously with the frame preparation process so as to form the lead frame in which the step portions 265c are formed in the leads 265. It is possible to reduce the thickness of the step portions 265c of the leads 265 by way of etching before the press working. In that case, it is possible to improve the precision of processing the step portions 265c.

Figure 24:
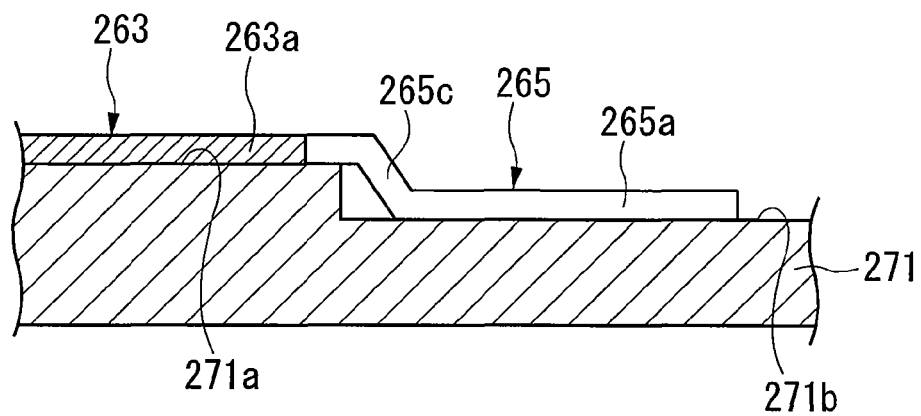
FIG. 24 is a cross-sectional view showing that distal ends of leads included in the semiconductor device are mounted on a heat stage in the wiring process.

In the wiring process, as shown in FIG. 24, there is provided a heat stage 271 having a step portion forming an upper surface 271a and a lower surface 271b. Herein, the distal end 263a of the lead 263 is mounted on the upper surface 271a of the heat stage 271, and the distal end 265a of the lead 265 is mounted on the lower surface 271b of the heat stage 271. Herein, the distal ends 263a and 265a should be reliably brought in contact with the upper surface 271a and the lower surface 271b of the heat state 271. This is because, when the distal end 265a of the lead 265 is partially floating above the surface 271b of the stage 271, it is difficult to appropriately apply ultrasonic waves to the distal ends 265a of the leads 265 joining the wires 269, thus degrading the joint strength between the distal ends 265a of the leads 265 and the wires 269.

The manufacturing method of the semiconductor device 261 is characterized in that the step portions 265c are formed in the leads 265 in the lead processing process, by which the distal ends 265a of the leads 265 can be reliably distanced from the distal ends 263a of the leads 263 in the thickness direction.

Similar to the semiconductor device 251, the semiconductor device 261 is designed such that the distal ends 263a of the leads 263 are distanced from the distal ends 265a of the leads 265 in both of the thickness direction and elongation direction of the leads 263 and 265. Thus, it is possible to reliably prevent the wires 267 and 269, which join the leads 263 and 265, from coming in contact with each other in proximity to the distal ends 263a and 265a of the leads 263 and 265.

The distal ends 265a of the leads 265 positioned close to the semiconductor chip 205 are positioned lower than the distal ends 263a of the leads 263. This further increases the differences between the loop heights of the wires 267 and 269 joining the leads 263 and 265, which adjoin together.

In the manufacturing of the semiconductor device 261, the wiring process is performed after the lead processing process. This eliminates the necessity of moving the distal ends 265a of the leads 265 after the wiring process; hence, it is possible to protect the joint portions between the leads 265 and the wires 269. That is, it is possible to improve the reliability in establishing electric connection between the semiconductor chip 205 and the leads 265.

Figure 25:
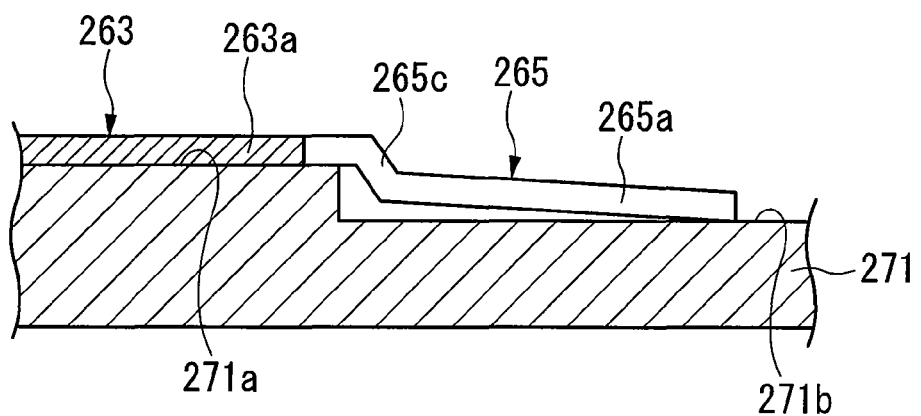
FIG. 25 is a cross-sectional view showing that the distal ends of the leads included in the semiconductor device are mounted on the heat stage in the wiring process in a different way.

In the semiconductor device 261, the distal ends 265a of the leads 265 are positioned substantially in parallel with the distal ends 263a of the leads 263; but this is not a restriction. For example, the lead 265 can be arranged as shown in FIG. 25 in such a way that the distal end 265a is gradually inclined downwardly from the base portion 265b via the bent portion 265c.

In the above, even when a dispersion occurs in height with respect to the distal end 265a positioned relative to the base portion 265b of the lead 265 due to the precision of processing the step portion 265c in the lead processing process, it is possible to reliably bring the distal end 265a in contact with the surface 271b of the heat stage 271 in the wiring process. This makes it possible to appropriately apply ultrasonic waves to the distal ends 265a of the leads 265 joining the wires 269; hence, it is possible to secure a sufficiently high joint strength between the leads 265 and the wires 269.

As described heretofore, the bent portions 255c are formed in the lead 255 so as to lower the positions of the distal ends 255a in the semiconductor device 251; and the step portions 265c are formed in the leads 265 so as to lower the positions of the distal ends 265a in the semiconductor device 261; but these are not restrictions. Because, it is simply required that the distal ends 253a and 263a of the leads 253 and 263 be positioned higher than the distal ends 255a and 265a of the leads 255 and 265. For example, without forming the bent portions 255c and the step portions 265c in the leads 255 and the leads 265, respectively, it is possible to form bent portions and step portions in the leads 253 and 263 so as to raise the positions of the distal ends 253a and 263a upwardly. That is, it is possible to form bent portions and step portions in both of the leads 253 and 263 and the leas 255 and 265.

When bent portions and step portions are formed in the leads 253 and 263, the loop heights of the wires 257 and 267 become higher so as to increase the thickness of the semiconductor devices 251 and 261. For this reason, it may be preferable that the bent portions 255c and the step portions 265c be formed in the leads 255 and the leads 265, respectively.

In the third embodiment and its variations, the electrode pads 207 and 209 are arranged in a zigzag manner in connection with the semiconductor chip 205; but this is not a restriction. That is, the third embodiment simply requires that the electrode pads 207 and 209 be aligned in alignment directions of the leads 211 and 213, the leads 212 and 214, the leads 253 and 255, and the leads 263 and 265. That is, the electrode pads 207 and 209 can be linearly aligned in the aforementioned alignment directions.

Lastly, the present invention is not necessarily limited to the aforementioned embodiments and variations; hence, it can be further modified within the scope of the invention defined by the appended claims.

What is claimed is:

1. A semiconductor device in which a plurality of leads are each connected to a plurality of electrode pads formed in a periphery of a semiconductor chip via a plurality of wires, said semiconductor device comprising:
   a first set of electrode pads that are aligned adjacent to each other in a first line, which is defined opposite to and at a first distance from a first lead, wherein a plurality of first electrode bonds corresponding to the first set of the electrode pads are connected to a plurality of first lead bonds aligned in the first lead in its longitudinal direction via a first set of wires each having a respective first loop height; and
   a second set of electrode pads that are aligned adjacent to each other in a second line, which is defined opposite to and at a second distance from a second lead, wherein the second distance is greater than the first distance and the second lead is arranged adjacent to and in parallel with the first lead, wherein a plurality of second electrode bonds corresponding to the second set of electrode pads are connected to a plurality of second lead bonds aligned in the second lead in its longitudinal direction via a second set of wires each having a respective second loop height that is greater than each of the first loop heights,
   wherein a first lead bond that is farthest from the first line among the plurality of first lead bonds is connected to one of the first electrode bonds except for a first electrode bond positioned closest to the second line, and/or
   wherein a second lead bond that is closest to the second line among the plurality of second lead bonds is connected to one of the second electrodes bonds except for a second electrode bond positioned closest to the first line.

2. The semiconductor device according to claim 1, wherein the first set of the wires include a first plurality of raised portions, which vertically rise from the first set of the electrode pads, and the second set of the wires include a second plurality of raised portions, which vertically rise from the second of the electrode pads.

3. A semiconductor device in which a plurality of leads are each connected to a plurality of electrode pads formed in a periphery of a semiconductor chip via a plurality of wires, said semiconductor device comprising:
   a first set of the electrode pads that are aligned adjacent to each other in a first line, which is defined opposite to and at a first distance from a first lead, wherein a plurality of first electrode bonds corresponding to the first set of the electrode pads are connected to a plurality of first lead bonds aligned in the first lead in its longitudinal direction via a first set of the wires each having a first loop height; and
   a second set of the electrode pads that are aligned adjacent to each other in a second line, which is defined opposite to and at a second distance from a second lead, wherein the second distance is greater than the first distance and the second lead is arranged adjacent to and in parallel with the first lead, wherein a plurality of second electrode bonds corresponding to the second set of the electrode pads are connected to a plurality of second leads bonds aligned in the second lead in its longitudinal direction via a second set of the wires each having a second loop height that is greater than each of the first loop heights,
   wherein a first wire within the first set of the wires crosses a second wire within the second set of the wires in plan view but with a prescribed height difference therebetween at an intersecting point, and
   wherein the prescribed height difference between the first wire and the second wire is larger than a height difference between the first wire and one wire of the second set of wires that is adjacent to the second wire and is also larger than a height difference between the second wire and one wire of the first set of wires that is adjacent to the first wire.

* * * * *